United States Patent
Chen et al.

(10) Patent No.: US 10,852,624 B2
(45) Date of Patent: Dec. 1, 2020

(54) CAMERA DEVICE

(71) Applicants: HU SHAN AUTO PARTS INC., New Taipei (TW); INVENTEC BESTA CO., LTD., Taipei (TW)

(72) Inventors: Ying-Chih Chen, New Taipei (TW); Jen-Chien Chang, New Taipei (TW); Ching-Chaing Tsai, Taipei (TW)

(73) Assignees: HU SHAN AUTO PARTS INC., New Taipei (TW); INVENTEC BESTA CO., LTD., Taipei (TW)

( * ) Notice: Subject to any disclaimer, the term of this patent is extended or adjusted under 35 U.S.C. 154(b) by 0 days.

(21) Appl. No.: 16/385,875

(22) Filed: Apr. 16, 2019

(65) Prior Publication Data

US 2020/0142280 A1 May 7, 2020

(30) Foreign Application Priority Data

Nov. 1, 2018 (TW) .............................. 107138733 A

(51) Int. Cl.
| | |
|---|---|
| *G03B 17/12* | (2006.01) |
| *H05K 1/18* | (2006.01) |
| *B60R 11/04* | (2006.01) |
| *H01R 12/75* | (2011.01) |

(52) U.S. Cl.
CPC .............. *G03B 17/12* (2013.01); *H05K 1/18* (2013.01); *B60R 11/04* (2013.01); *H01R 12/75* (2013.01); *H05K 2201/10121* (2013.01); *H05K 2201/10151* (2013.01); *H05K 2201/10189* (2013.01)

(58) Field of Classification Search
CPC .......... B60R 11/04; H05K 1/18; H01R 12/75; G03B 17/12

USPC .......................................................... 396/529
See application file for complete search history.

(56) References Cited

U.S. PATENT DOCUMENTS

| | | | | |
|---|---|---|---|---|
| 2010/0321497 | A1* | 12/2010 | Onishi | B60R 1/10 348/148 |
| 2012/0314122 | A1* | 12/2012 | Yamashita | G02B 5/1895 348/360 |
| 2014/0168507 | A1* | 6/2014 | Renaud | H04N 5/2257 348/373 |
| 2016/0191863 | A1* | 6/2016 | Minikey, Jr. | H04N 5/2251 348/148 |
| 2018/0194328 | A1* | 7/2018 | Numakunai | G03B 17/02 |
| 2019/0077333 | A1* | 3/2019 | Abe | H04N 7/181 |
| 2019/0208626 | A1* | 7/2019 | Han | H04N 5/225 |

(Continued)

*Primary Examiner* — Clayton E. LaBalle
*Assistant Examiner* — Dennis Hancock
(74) *Attorney, Agent, or Firm* — Hamre, Schumann, Mueller & Larson, P.C.

(57) ABSTRACT

A camera device includes a lens module, a mounting casing, and a base member. The lens module includes a housing, a camera unit mounted in and partially exposed from the housing, and a wire electrically connected to the camera unit. The mounting casing includes a main body having a front wall formed with a front window and a surrounding wall peripherally extending from the front wall and cooperating with the front wall to define a receiving space being in spatial communication with the front window, and two connecting portions extending from the surrounding wall of the main body. The housing is disposed in the receiving space to expose the camera unit from the front window. The base member is connected to the housing and the mounting casing.

11 Claims, 24 Drawing Sheets

(56) References Cited

U.S. PATENT DOCUMENTS

2019/0227411 A1\* 7/2019 Park .................... H05K 9/00
2020/0059580 A1\* 2/2020 Park .................. H04N 5/2254

\* cited by examiner

CAMERA DEVICE

CROSS-REFERENCE TO RELATED APPLICATION

This application claims priority of Taiwanese Invention Patent Application No. 107138733, filed on Nov. 1, 2018.

FIELD

The disclosure relates to a camera device, and more particularly to a camera device having a small size and adapted for a support of a vehicle.

BACKGROUND

For driving safety, it has become a trend that a vehicle is equipped with a vehicle camera device to assist the driver in judging a surrounding environment of the vehicle. For example, the driver can confirm whether there are people, animals or other objects behind the vehicle by means of the vehicle camera device installed on the rear side of the vehicle. Alternatively, for eliminating blind spots of the driver's vision when the vehicle turns, the vehicle camera devices are respectively installed on the left and right sides of the vehicle.

The existing micronized vehicle camera devices have various configurations for different types and brands of vehicles. However, there is still room for improvement of the existing vehicle camera devices in terms of convenience in production and assembly.

SUMMARY

Therefore, an object of the disclosure is to provide a camera device that can alleviate at least one of the drawbacks of the prior art.

According to the disclosure, a camera device includes a lens module, a mounting casing, and a base member.

The lens module includes a housing having an accommodating space, a camera unit fixedly mounted in and partially exposed from the housing, and a wire electrically connected to the camera unit.

The mounting casing includes a main body having a front wall formed with a front window and a surrounding wall peripherally extending from the front wall and cooperating with the front wall to define a receiving space that is in spatial communication with the front window and has an opening opposite to the front wall, and two connecting portions extending from the surrounding wall and being opposite to the front wall. The housing is disposed in the receiving space to expose the camera unit from the front window.

The base member is connected to the housing of the lens module and the mounting casing in proximity to the opening of the receiving space.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
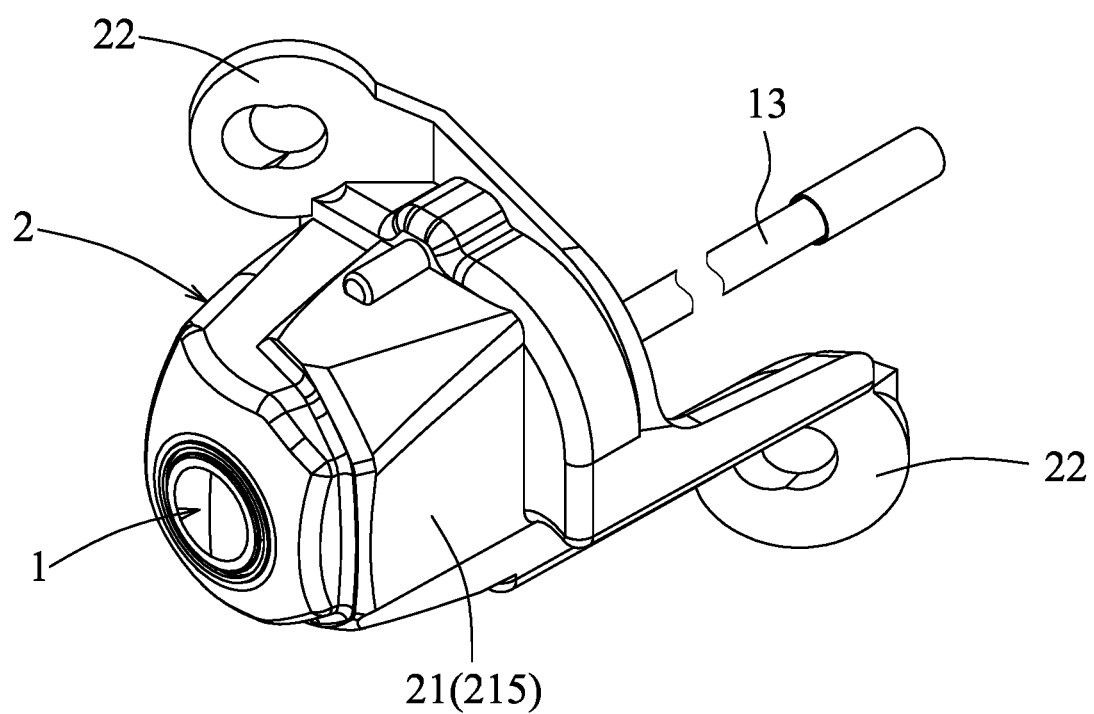
FIG. 1 is a fragmentary perspective view illustrating a first embodiment of a camera device according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
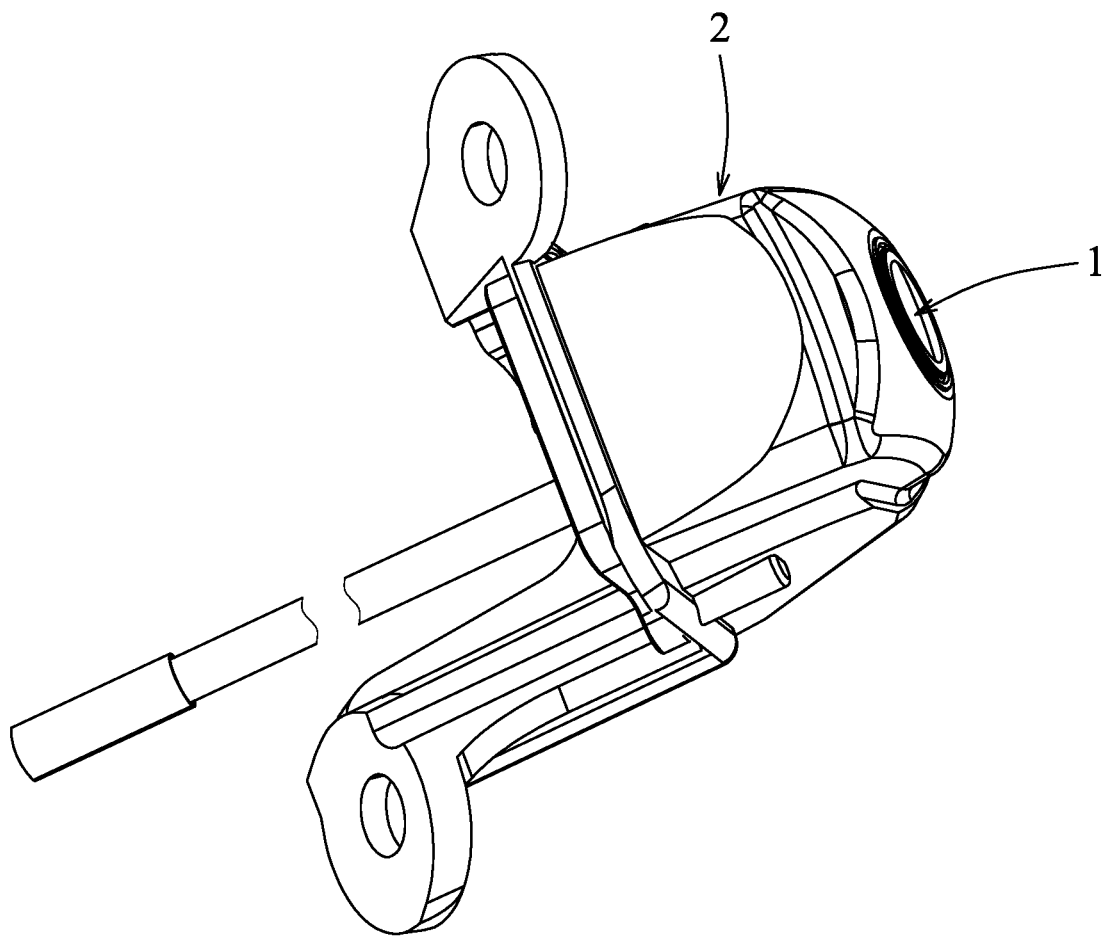
FIG. 2 is another fragmentary perspective view illustrating the first embodiment.
Figure 3:
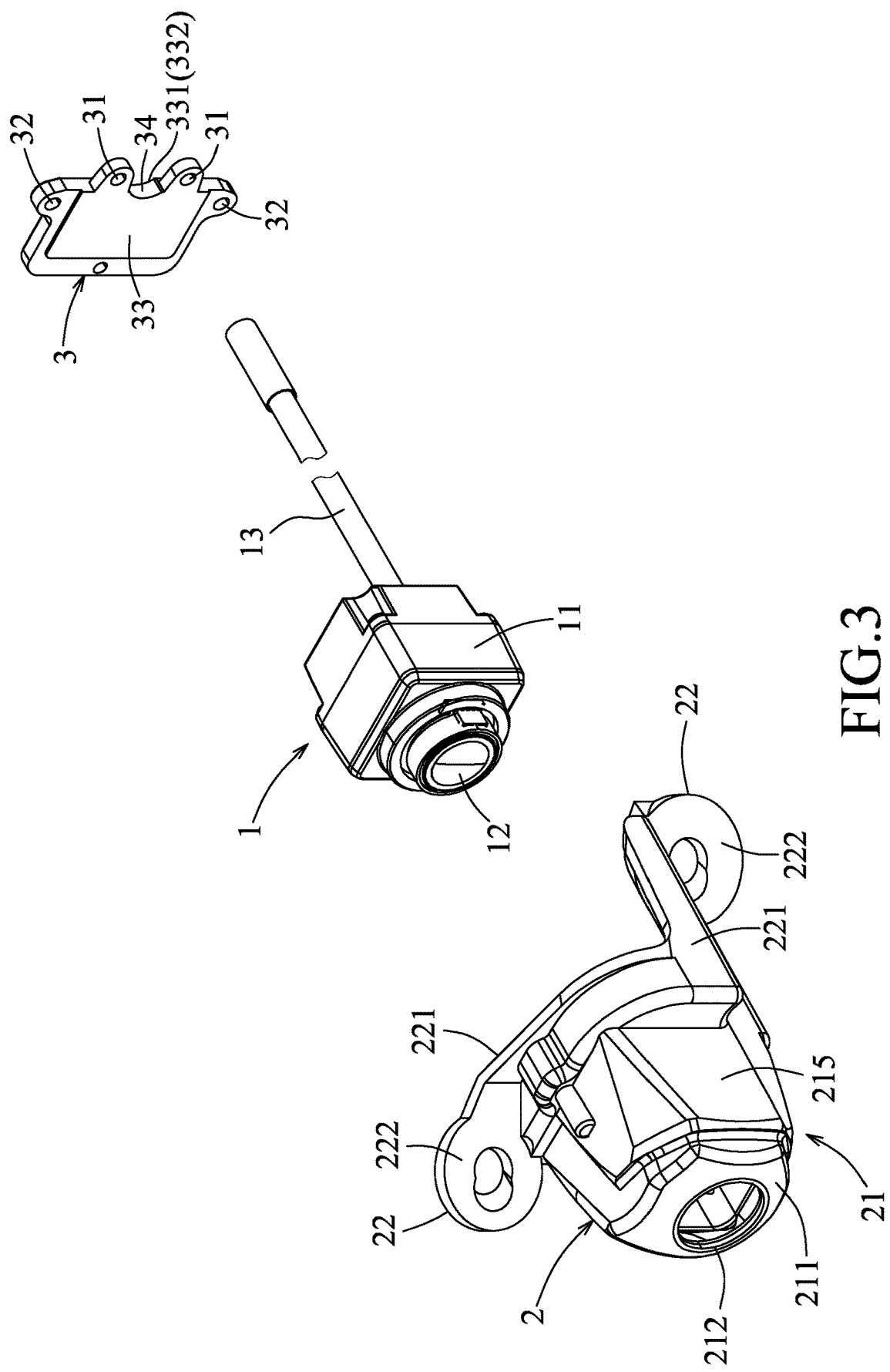
FIG. 3 is a fragmentary exploded view illustrating the first embodiment.
Figure 4:
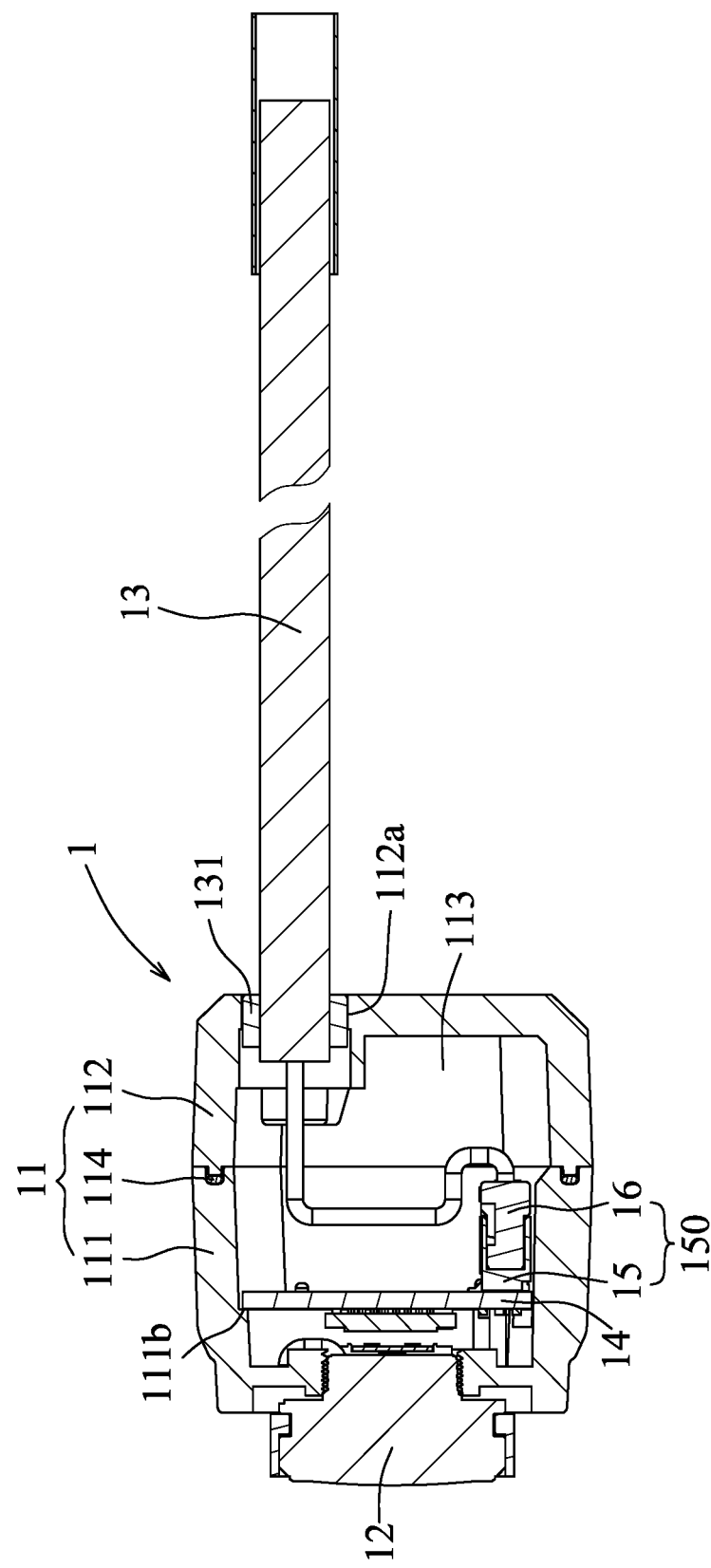
FIG. 4 is a fragmentary cross-sectional view illustrating a lens module of the first embodiment.
Figure 5:
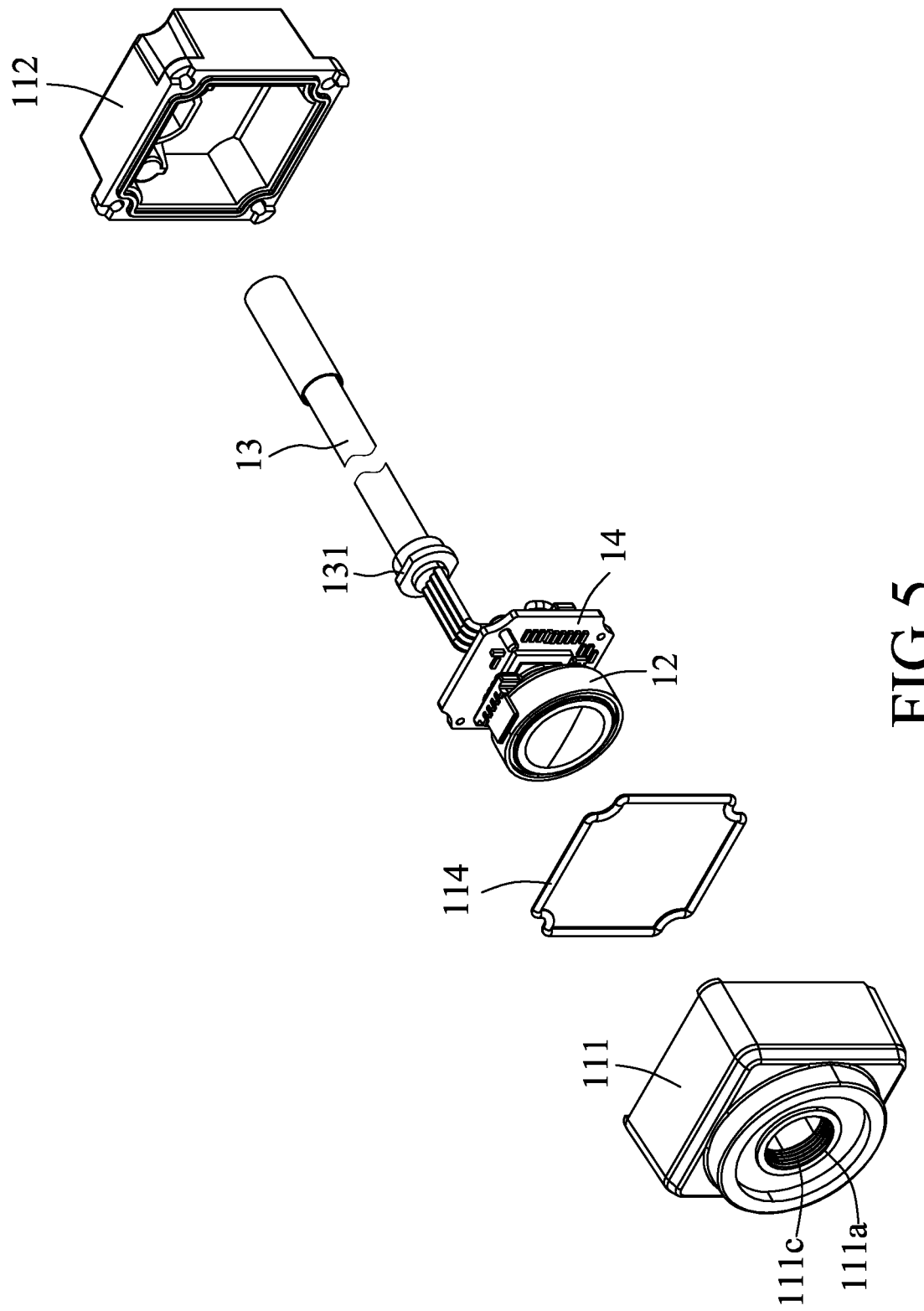
FIG. 5 is a fragmentary exploded view illustrating the lens module of the first embodiment.
Figure 6:
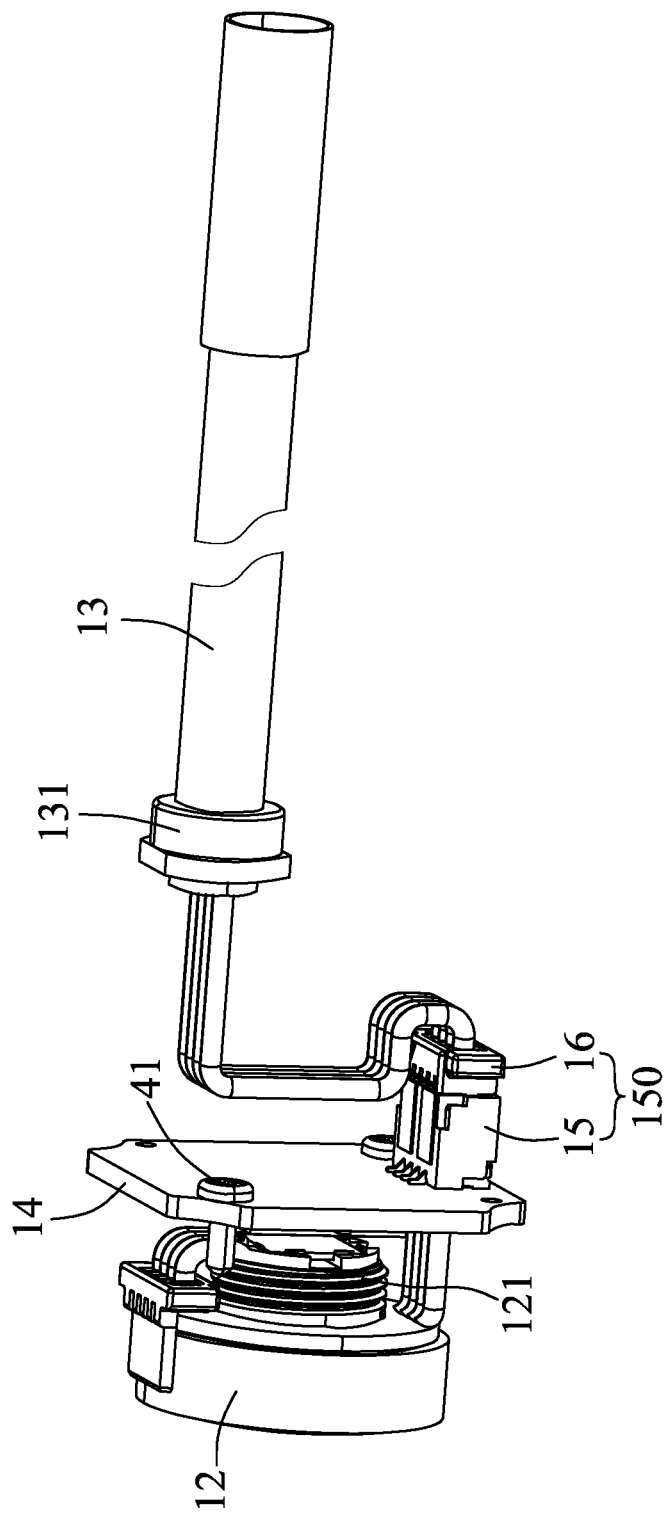
FIG. 6 is a fragmentary perspective view illustrating the lens module of the first embodiment with a housing removed.
Figure 7:
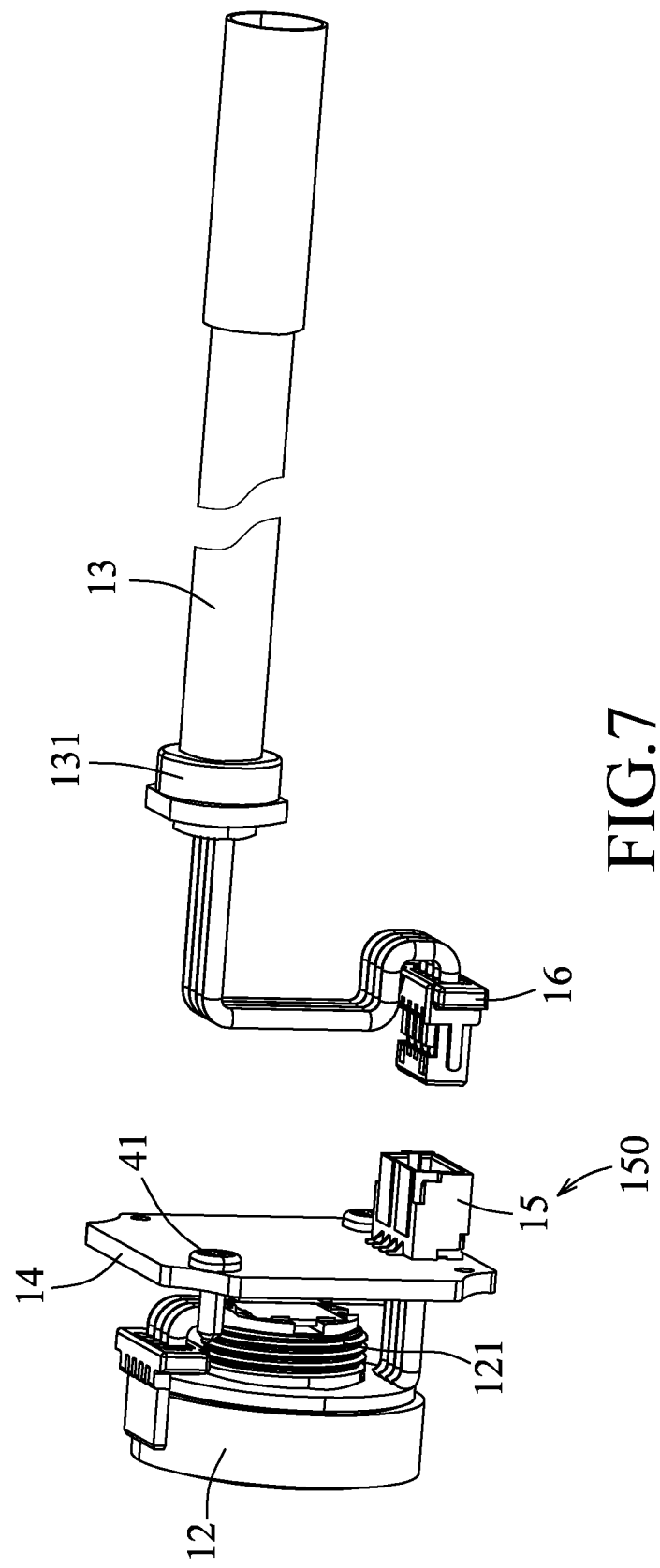
FIG. 7 is another fragmentary perspective view illustrating a wire and an electric circuit board of the lens module in a disconnected state.

Referring to FIGS. 1 to 3, a first embodiment of a camera device according to the disclosure includes a lens module 1, a mounting casing 2, and a base member 3. The camera device of the disclosure is adapted for being disposed on a support mounted to a vehicle (not shown), such as a frame of a vehicle.

Further referring to FIGS. 4 to 7, the lens module 1 includes a housing 11, a camera unit 12 fixedly mounted in and partially exposed from the housing 11, and a wire 13 electrically connected to the camera unit 12. In this embodiment, the lens module 1 further includes an electric circuit board 14 and an electric connector unit 150. The electric circuit board 14 is disposed in the housing 11 and electrically connected to the camera unit 12. The electric connector unit 150 is disposed in the housing 11 and electrically interconnects the electric circuit board 14 and the wire 13 such that the wire 13 of the lens module 1 is electrically connected to the camera unit 12 through the electric circuit board 14 and the electric connector unit 150.

The mounting casing 2 includes a main body 21 and two connecting portions 22. The main body 21 has a front wall 211 formed with a front window 212, and a surrounding wall 215 peripherally extending from the front wall 211 and cooperating with the front wall 211 to define a receiving space 213. The receiving space 213 is in spatial communication with the front window 212 and has an opening 214 opposite to the front window 212. The connecting portions 22 extend from the surrounding wall 215 and are opposite to the front wall 211. The housing 11 is disposed in the receiving space 213 to expose the camera unit 12 from the front window 212. The base member 3 is connected to the housing 11 of the lens module 1 and the mounting casing 2 in proximity to the opening 214 of the receiving space 213, such that the camera unit 1 and the mounting casing 2 are positioned relative to the base member 3.

To be specific, the housing 11 of the lens module 1 includes a front housing part 111 and a rear housing part 112 engaged with each other to define an accommodating space 113 for accommodating the camera unit 12, the electric circuit board 14 and the electric connector unit 150. The front housing part 111 is formed with a front through hole 111a for exposing the camera unit 12. The rear housing part 112 is formed with a rear through hole 112a for the wire 13 to pass therethrough. The housing 11 further includes a protrusion 111b projecting from the front housing part 111 toward the accommodating space 113 for abutment of the electric circuit board 14 of the lens module 1 thereagainst. In this embodiment, the camera unit 12 has an outer thread 121. The front housing part 111 has an inner surface surrounding the front through hole 111a and formed with an inner thread 111c that is threadedly engaged with the outer thread 121 of the camera unit 12 such that the camera unit 12 is secured to the front housing part 111. The electric circuit board 14 is further secured to the protrusion 111b through a fixing member 41 (e.g. a screw).

The electric connector unit 150 includes a first electric connector 15 that is disposed on the electric circuit board 14 and a second electric connector 16 that is disposed in the accommodating space 113 of the housing 11 and electrically interconnects the wire 13 of the lens module 1 and the first electric connector 15. The first electric connector 15 and the camera unit 12 are respectively disposed on two opposite sides of the electric circuit board 14. The wire 13 of the lens module 1 further includes a retaining collar 131 fitted in the rear through hole 112a of the housing 11 of the lens module 1 so as to confine the wire 13 relative to the housing 11. In one form, the housing 11 of the lens module 1 further includes a sealing member 114 interposed between the front housing part 111 and the rear housing part 112 to seal a portion of the accommodating space 113 so as to prevent electric elements disposed in the sealed portion of the accommodating space 13, i.e., the electric circuit board 14, the electric connector unit 150 and a portion of the wire 13, from being affected by moisture. In addition, the wire 13 is electrically connected to the first electric connector 15 through the second electric connector 16 with an end located at the sealed portion of the accommodating space 113 connected to the second electric connector 16. By way of inclusion of the retaining collar 131 fitted in the rear through hole 112a of the housing 11, it is difficult for the wire 13 to be separated from the housing 11 and thus, electrical disconnection between the wire 13 and the electric circuit board 14 can be avoided.

Figure 8:
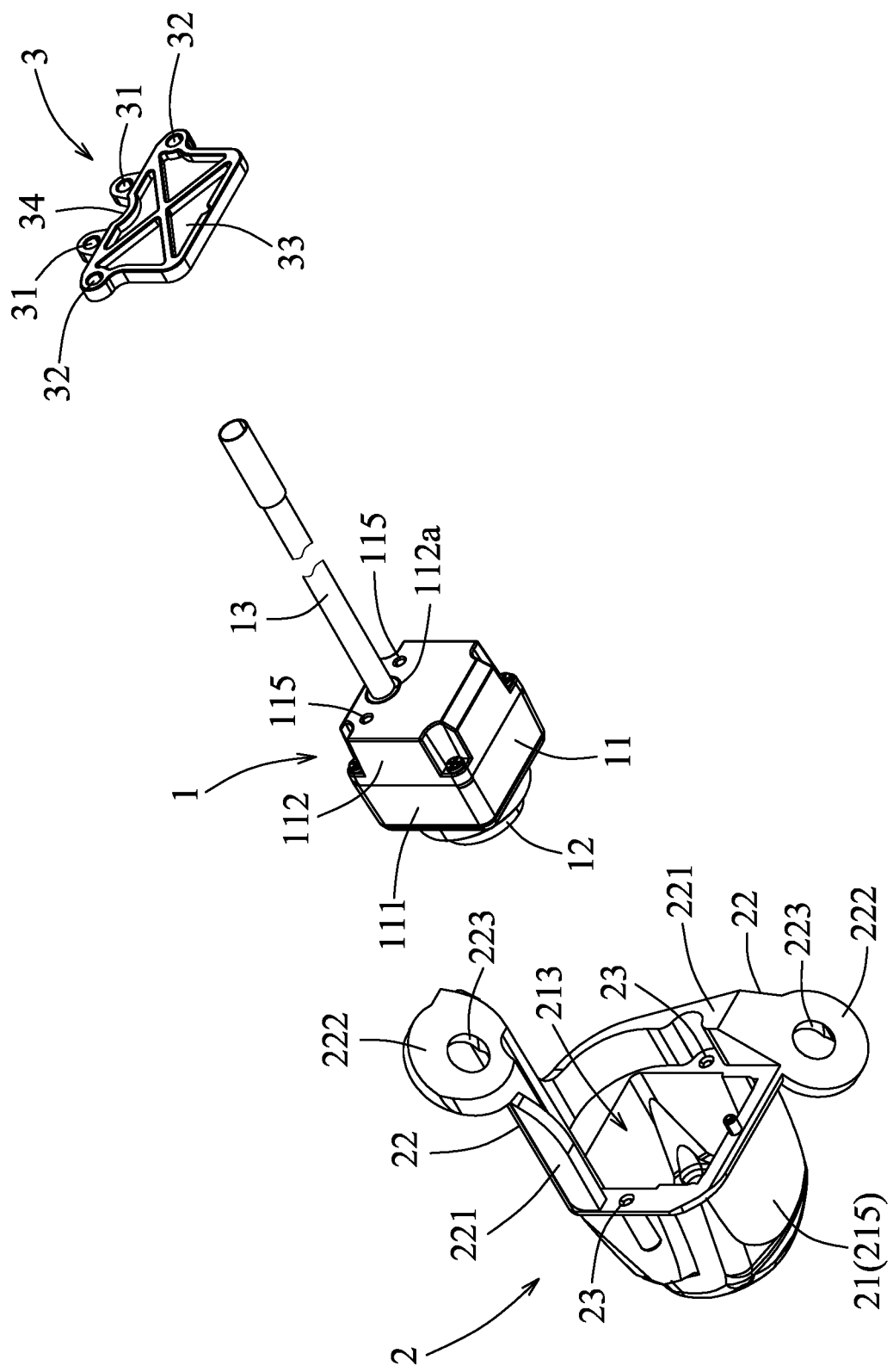
FIG. 8 is another fragmentary exploded view illustrating the first embodiment.
Figure 9:
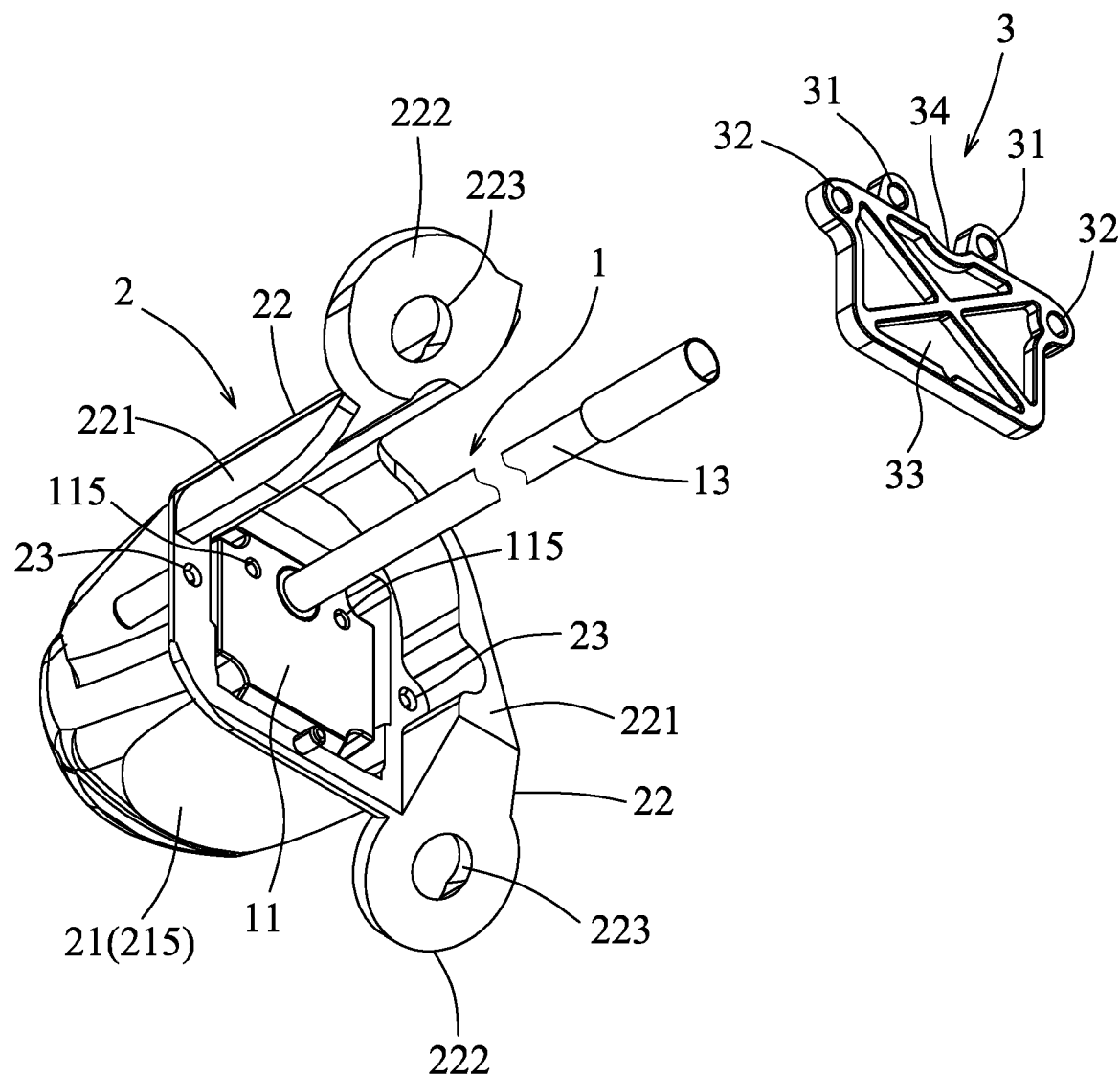
FIG. 9 is still another fragmentary exploded view illustrating the first embodiment.
Figure 10:
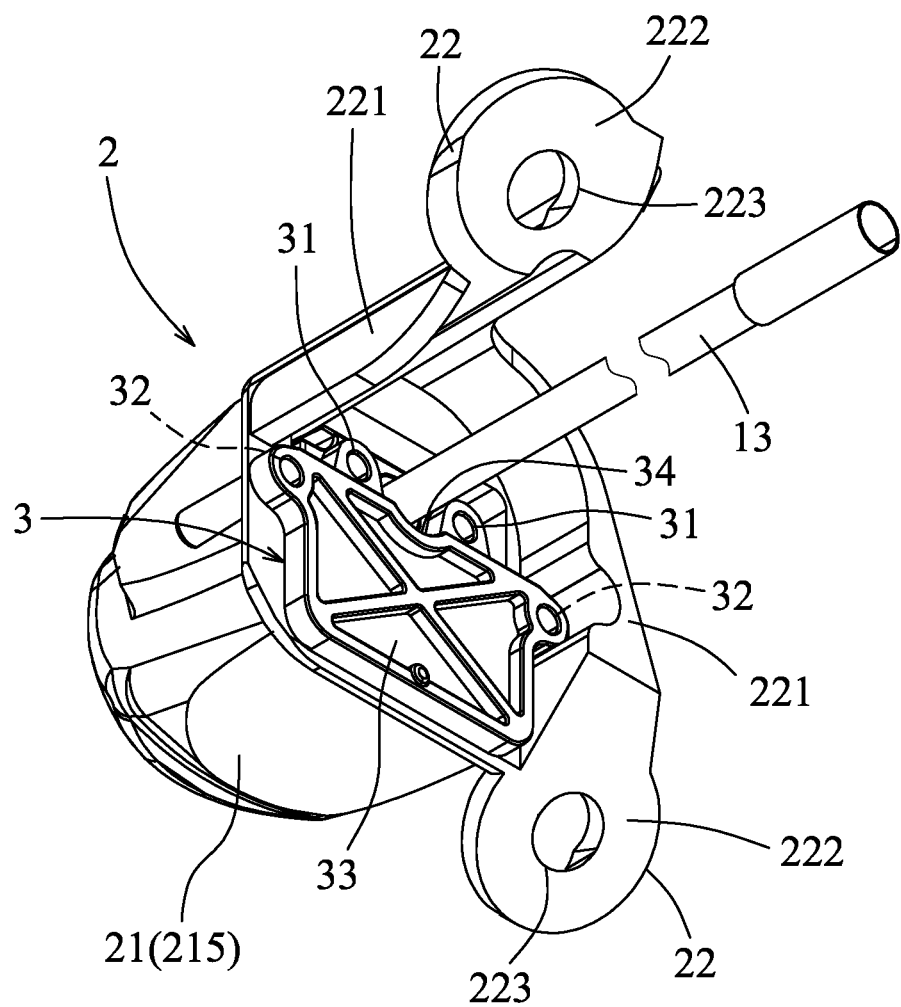
FIG. 10 is still another fragmentary perspective view illustrating the first embodiment.
Figure 11:
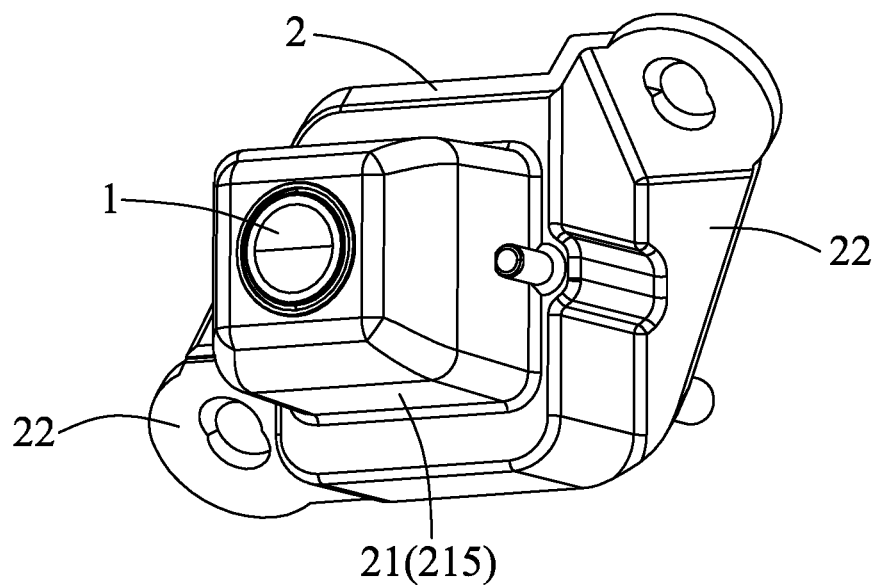
FIG. 11 is a fragmentary perspective view illustrating a second embodiment of the camera device according to the disclosure.
Figure 12:
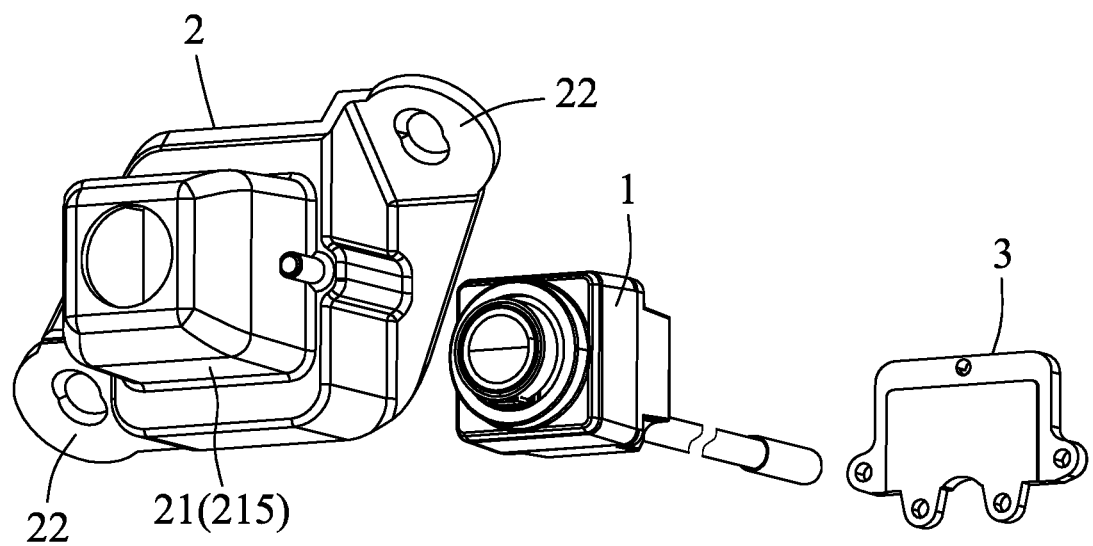
FIG. 12 is a fragmentary exploded view illustrating the second embodiment.
Figure 13:
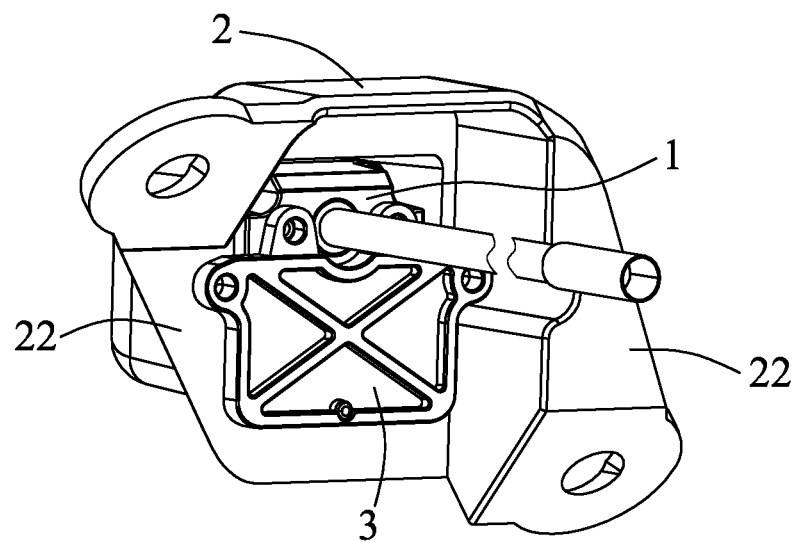
FIG. 13 is another fragmentary perspective view illustrating the second embodiment.
Figure 14:
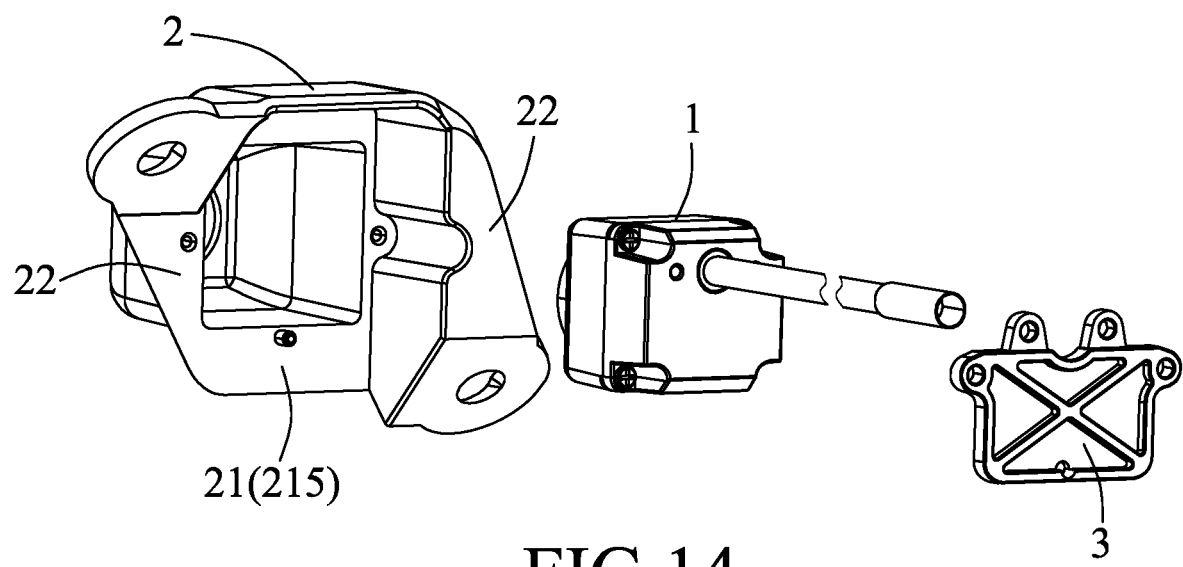
FIG. 14 is another fragmentary exploded view illustrating the second embodiment.
Figure 15:
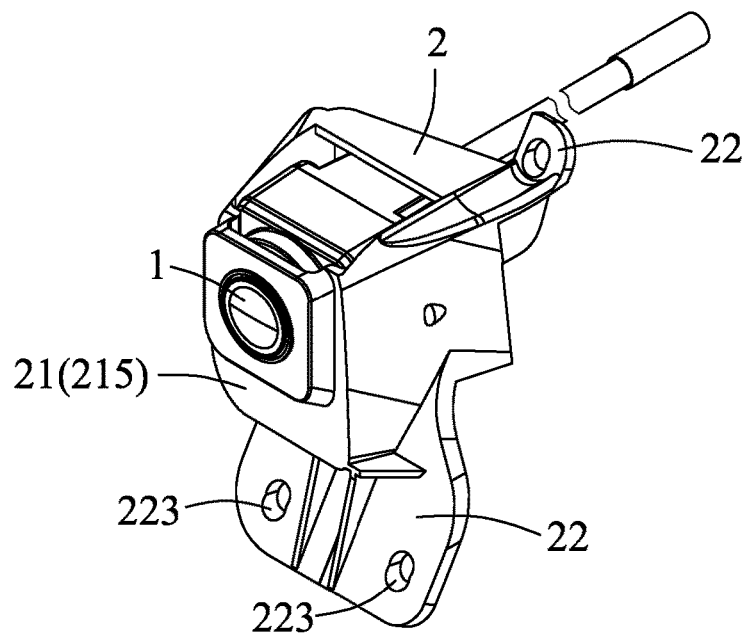
FIG. 15 is a fragmentary perspective view illustrating a third embodiment of the camera device according to the disclosure.
Figure 16:
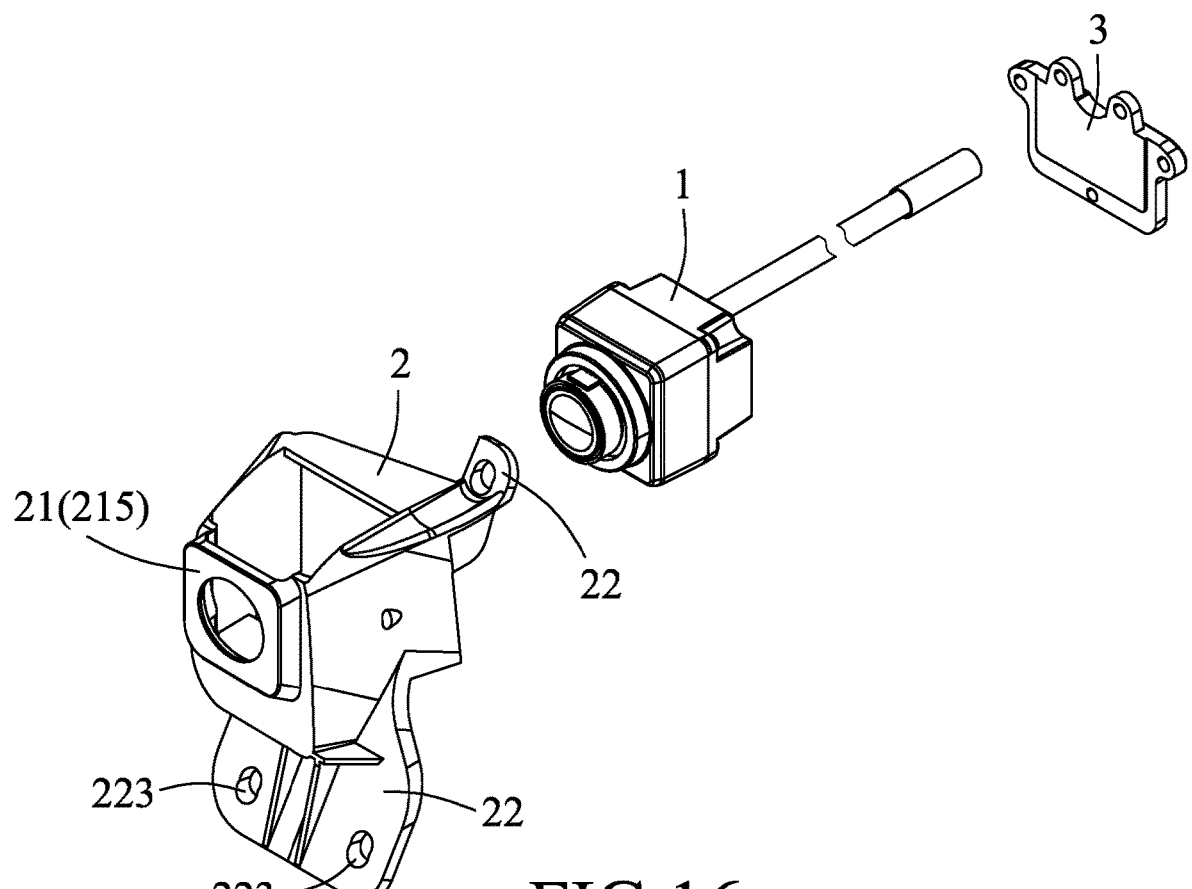
FIG. 16 is a fragmentary exploded view illustrating the third embodiment.
Figure 17:
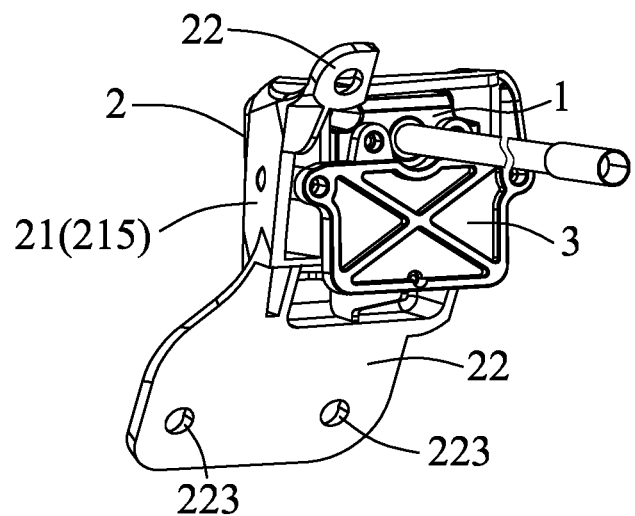
FIG. 17 is another fragmentary perspective view illustrating the third embodiment.
Figure 18:
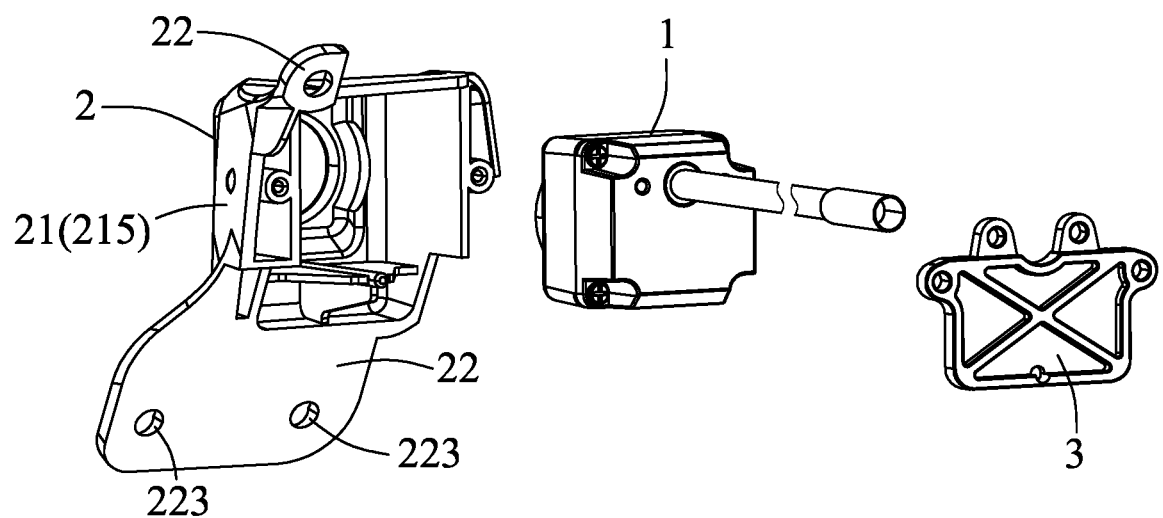
FIG. 18 is another fragmentary exploded view illustrating the third embodiment.
Figure 19:
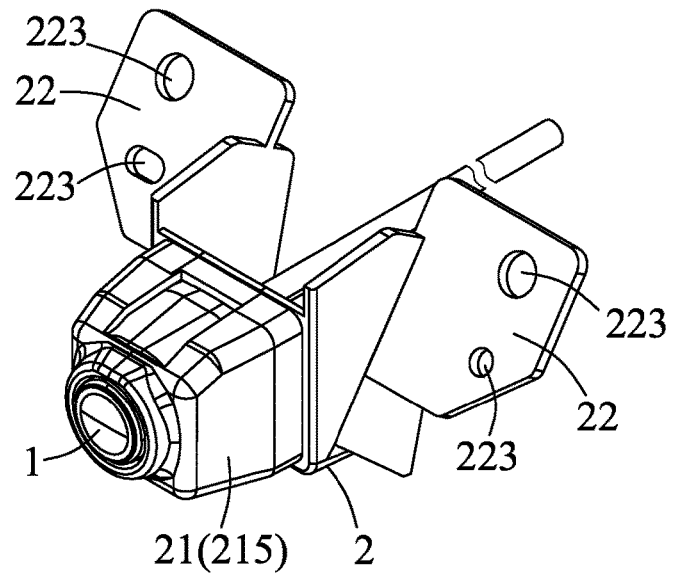
FIG. 19 is a fragmentary perspective view illustrating a fourth embodiment of the camera device according to the disclosure.
Figure 20:
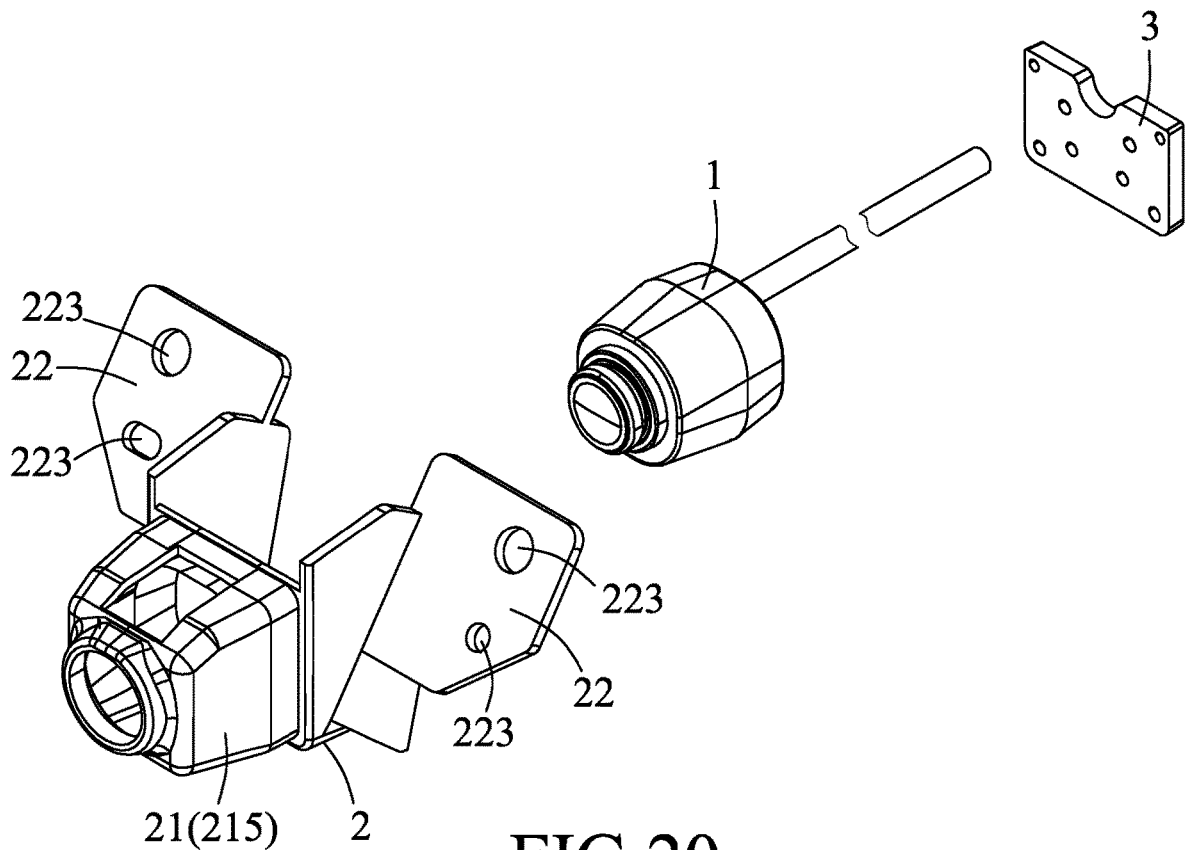
FIG. 20 is a fragmentary exploded view illustrating the fourth embodiment.
Figure 21:
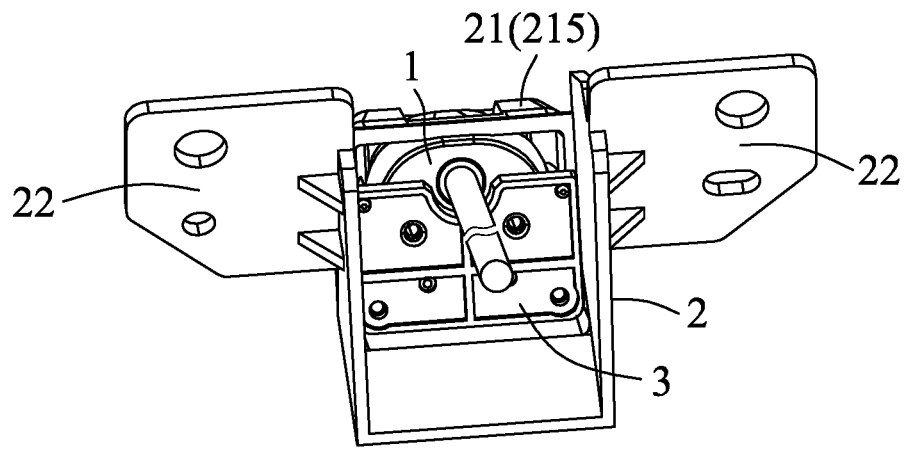
FIG. 21 is another fragmentary perspective view illustrating the fourth embodiment.
Figure 22:
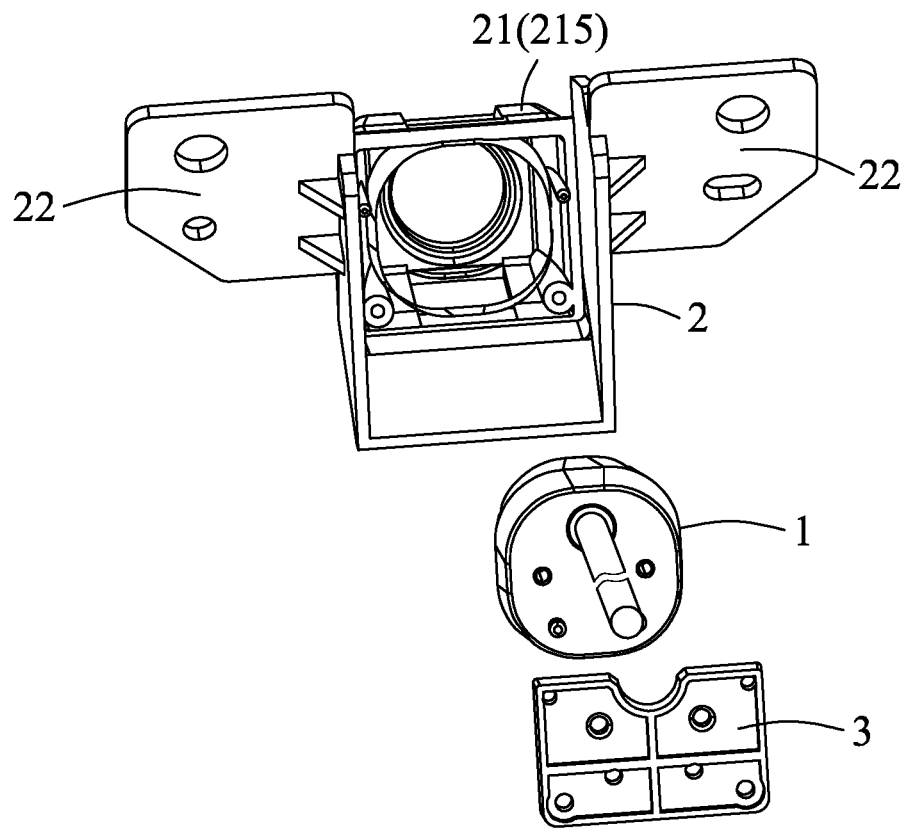
FIG. 22 is another fragmentary exploded view illustrating the fourth embodiment.
Figure 23:
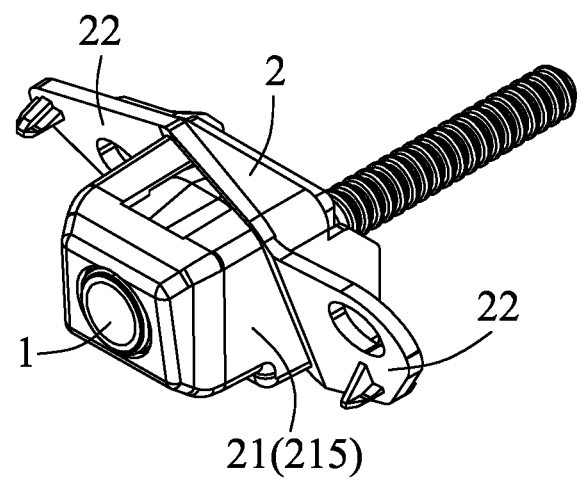
FIG. 23 is a fragmentary perspective view illustrating a fifth embodiment of the camera device according to the disclosure.
Figure 24:
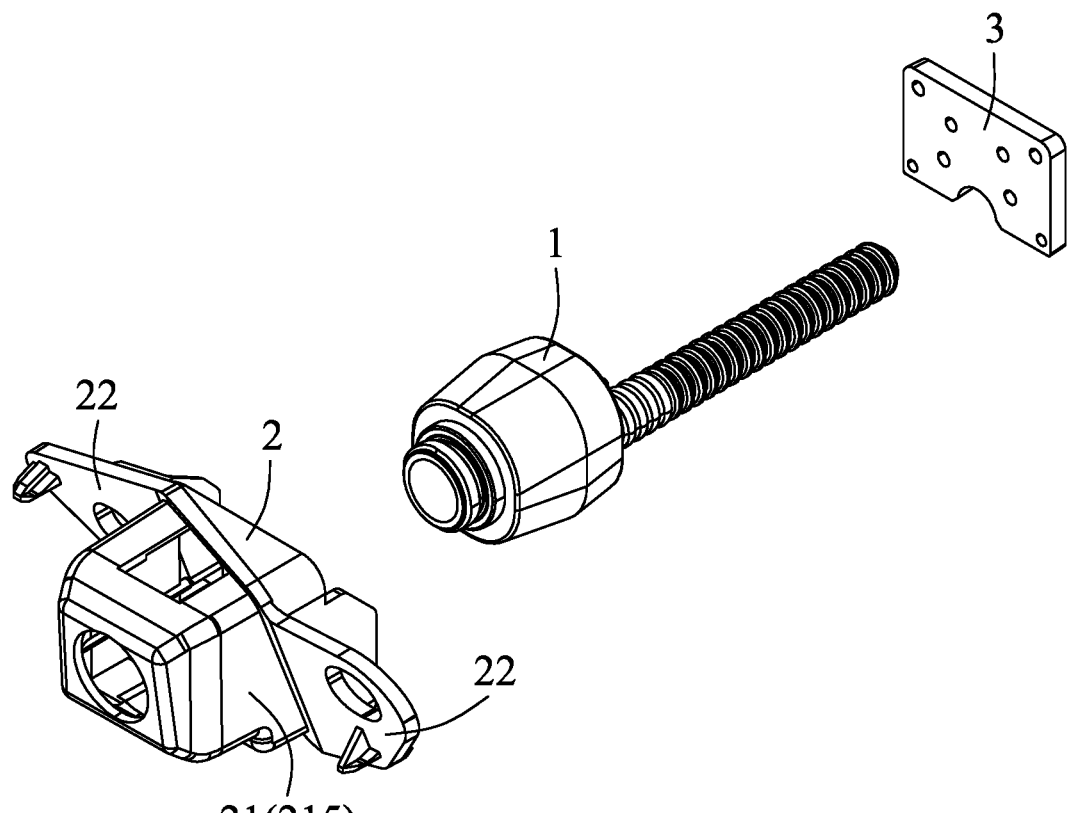
FIG. 24 is a fragmentary exploded view illustrating the fifth embodiment.
Figure 25:
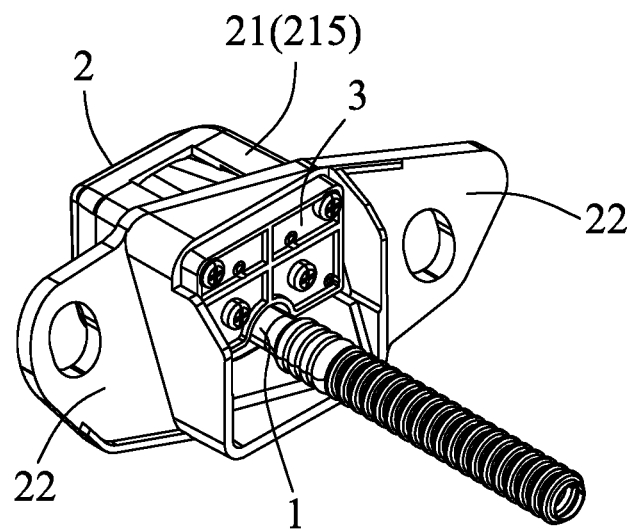
FIG. 25 is another fragmentary perspective view illustrating the fifth embodiment.
Figure 26:
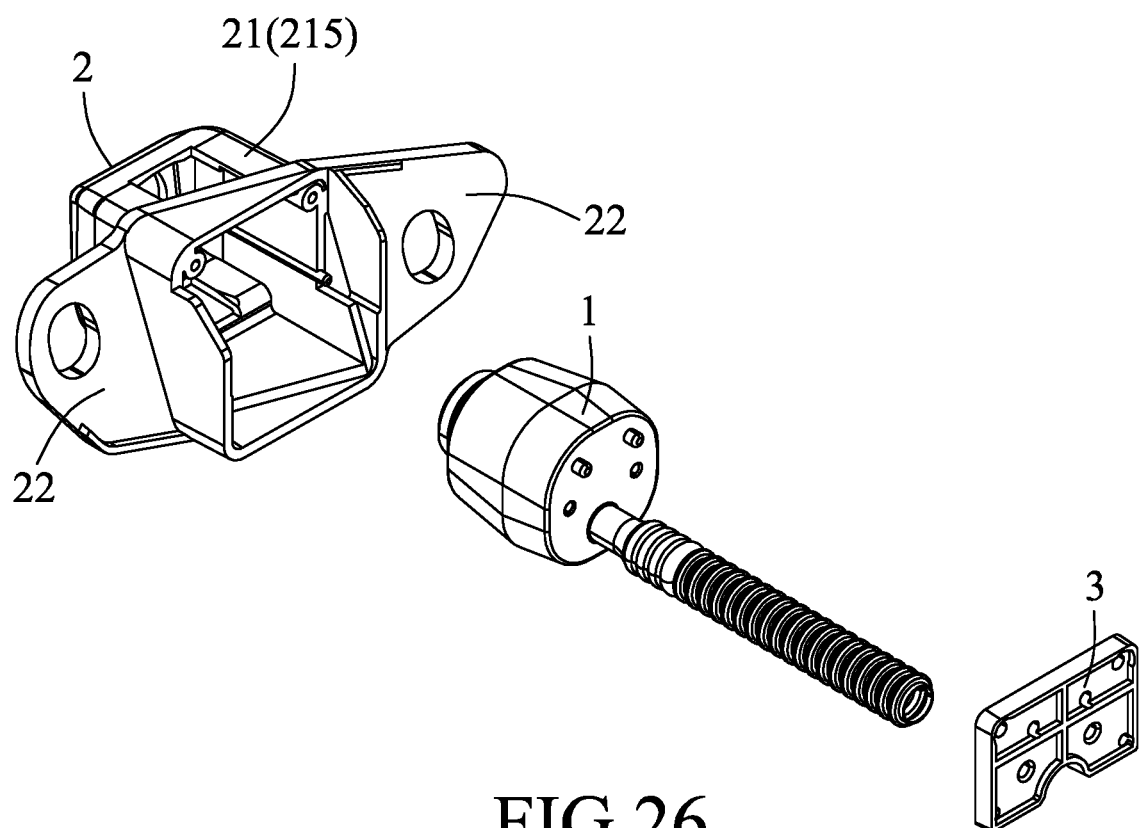
FIG. 26 is another fragmentary exploded view illustrating the fifth embodiment.
Figure 27:
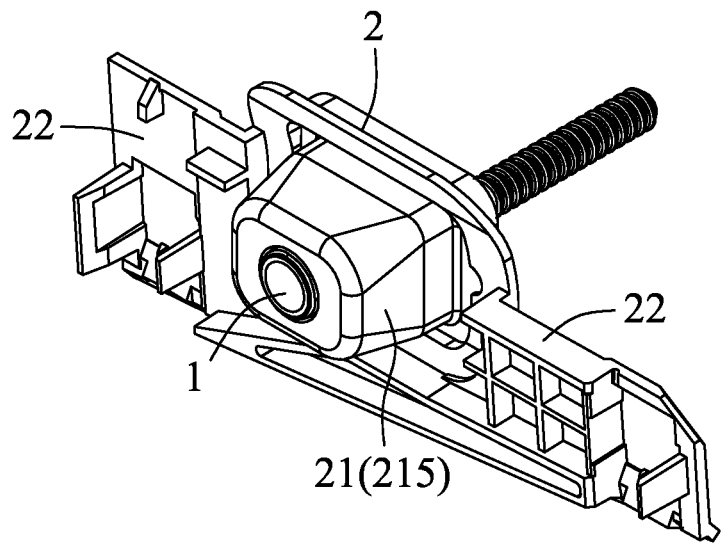
FIG. 27 is a fragmentary perspective view illustrating a sixth embodiment of the camera device according to the disclosure.
Figure 28:
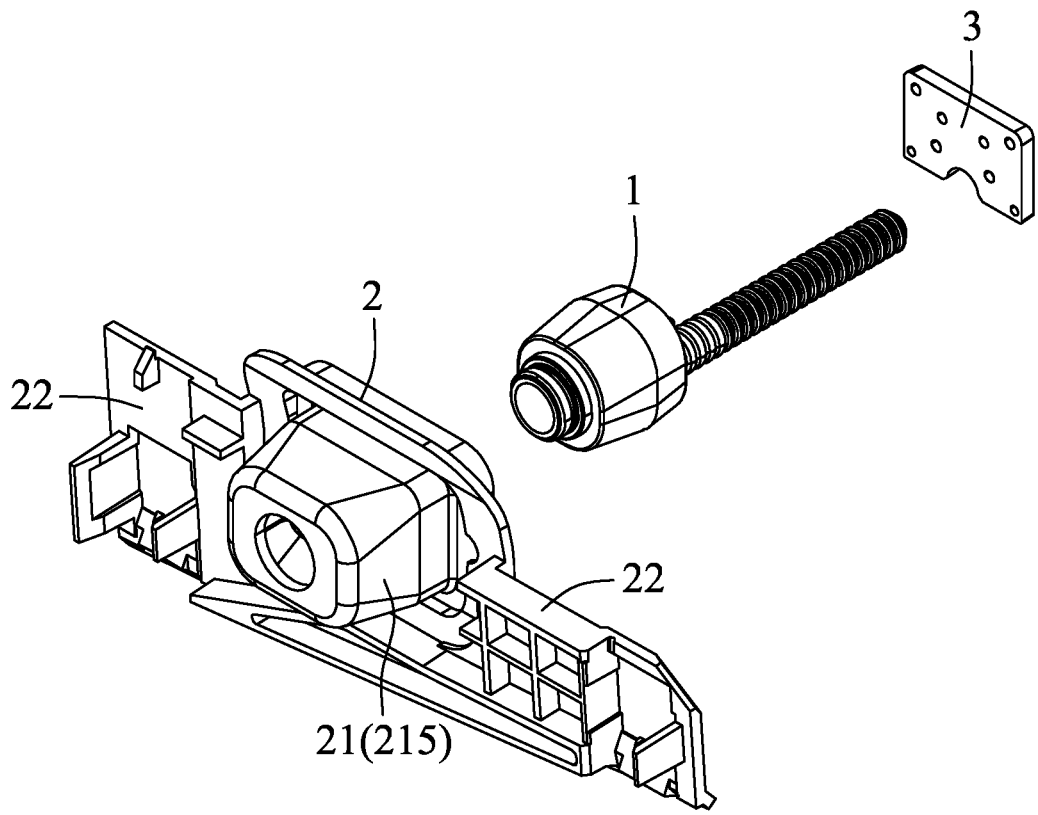
FIG. 28 is a fragmentary exploded view illustrating the sixth embodiment.
Figure 29:
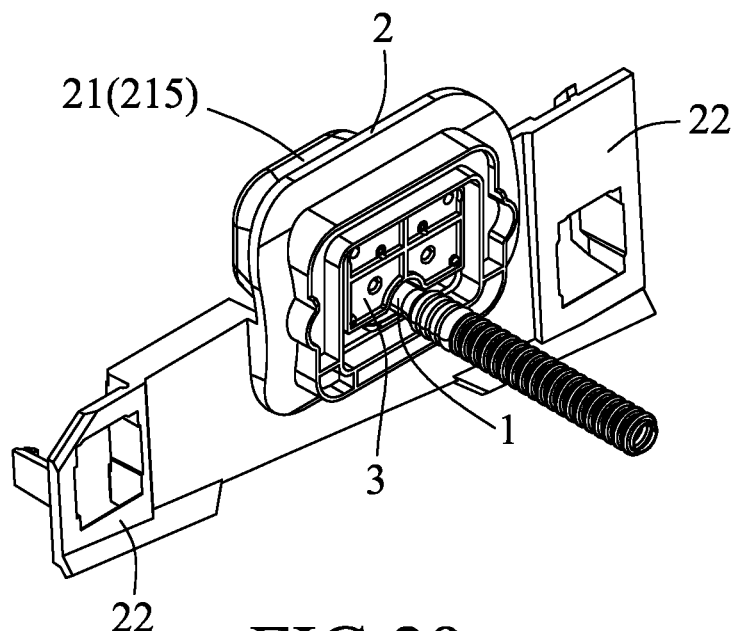
FIG. 29 is another fragmentary perspective view illustrating the sixth embodiment.
Figure 30:
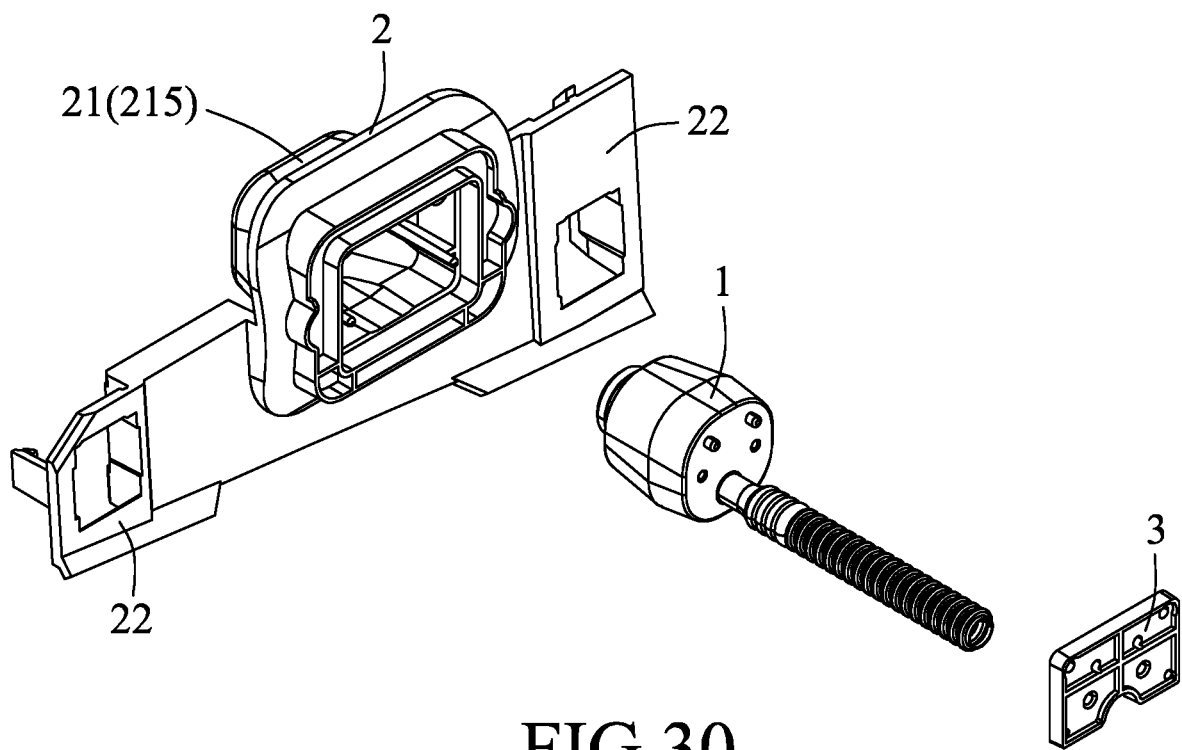
FIG. 30 is another fragmentary exploded view illustrating the sixth embodiment.
Figure 31:
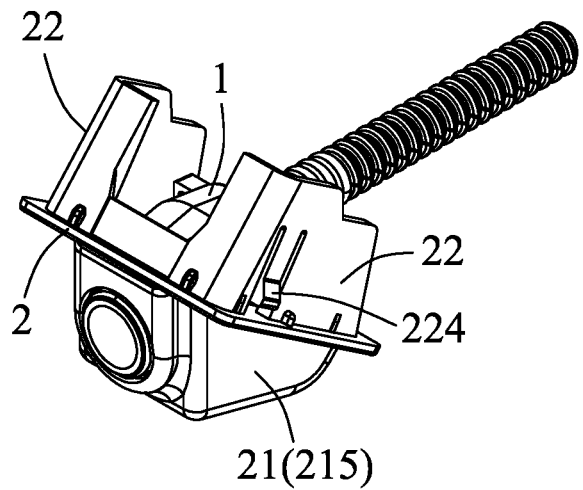
FIG. 31 is a fragmentary perspective view illustrating a seventh embodiment of the camera device according to the disclosure.
Figure 32:
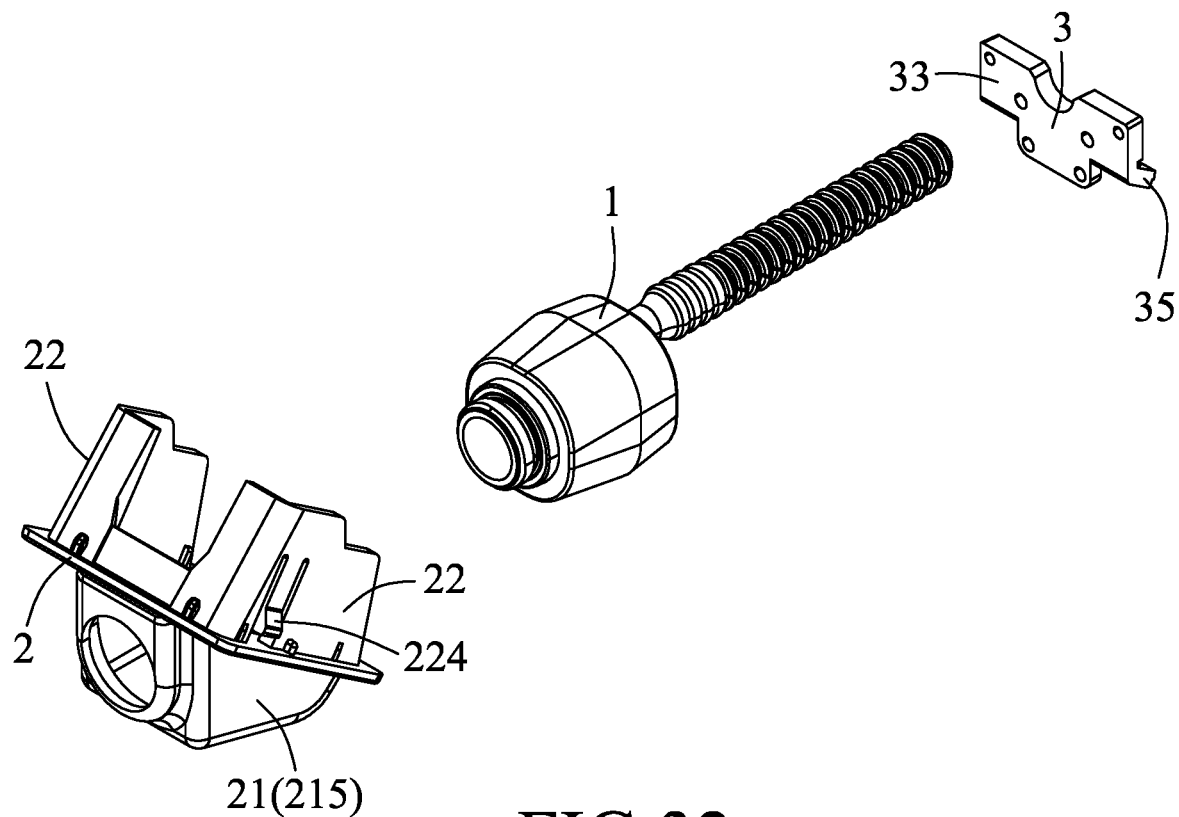
FIG. 32 is a fragmentary exploded view illustrating the seventh embodiment.
Figure 33:
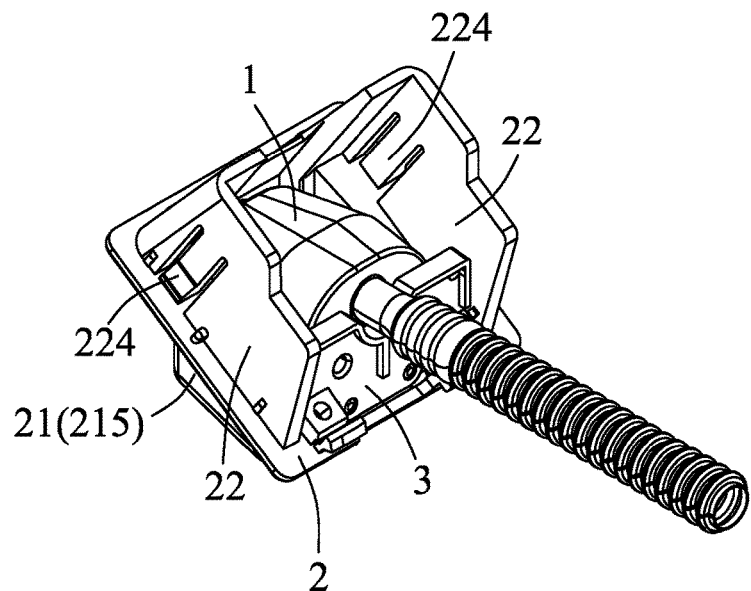
FIG. 33 is another fragmentary perspective view illustrating the seventh embodiment.
Figure 34:
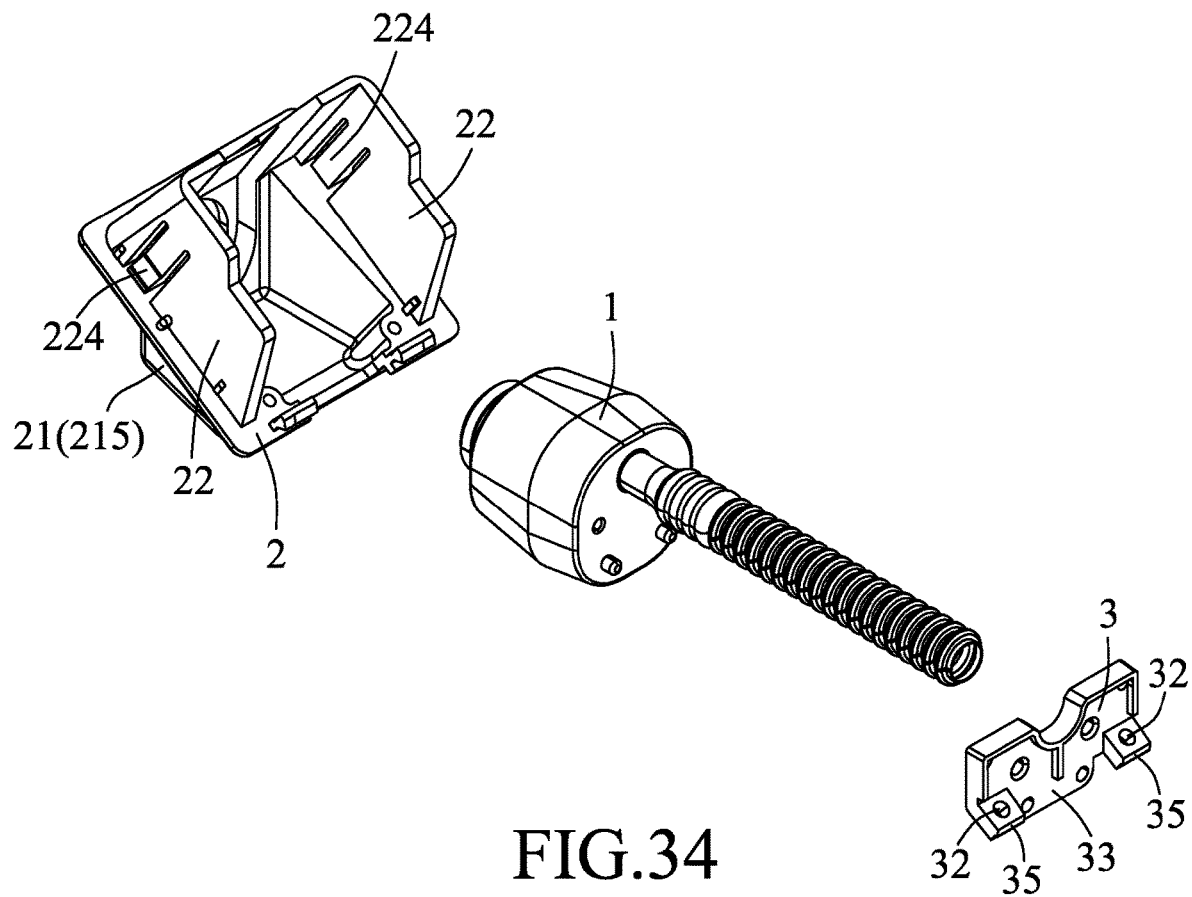
FIG. 34 is another fragmentary exploded view illustrating the seventh embodiment.
Figure 35:
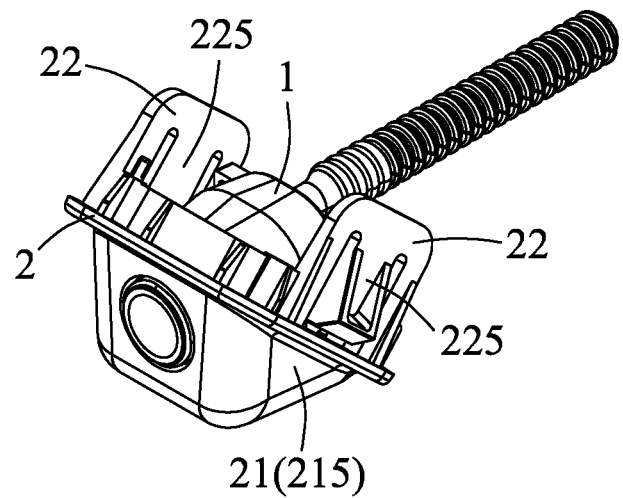
FIG. 35 is a fragmentary perspective view illustrating an eighth embodiment of the camera device according to the disclosure.
Figure 36:
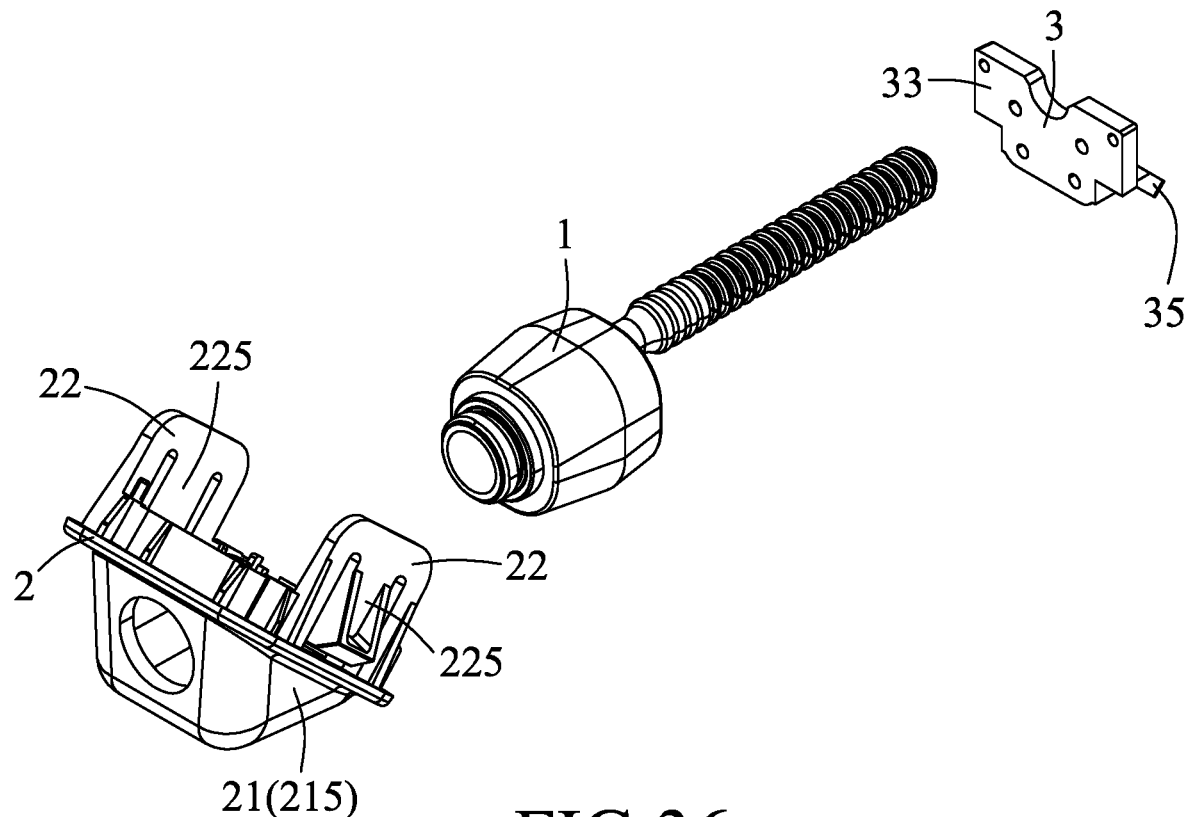
FIG. 36 is a fragmentary exploded view illustrating the eighth embodiment.
Figure 37:
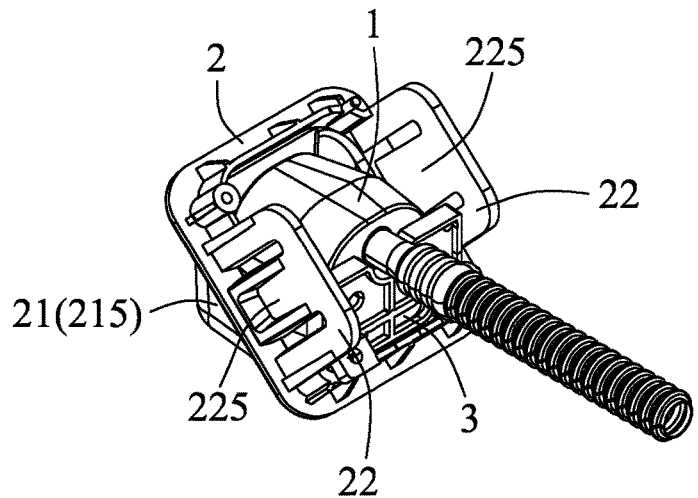
FIG. 37 is another fragmentary perspective view illustrating the eighth embodiment.
Figure 38:
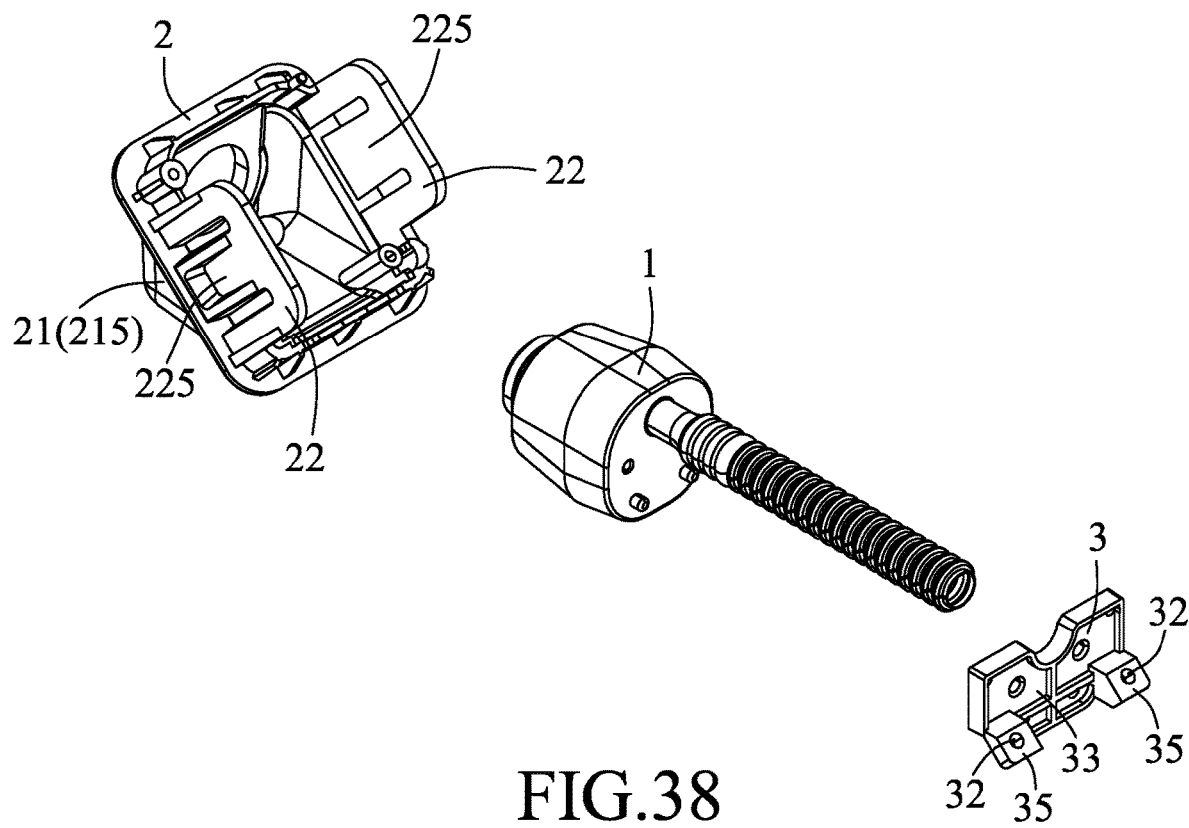
FIG. 38 is another fragmentary exploded view illustrating the eighth embodiment.

Referring to FIGS. 3, 8 and 10, the mounting casing 2 may be integrally formed. The camera unit 12 fixedly mounted in the housing 11 is positioned in the receiving space 213, and a part of the camera unit 12 that is exposed from and protrudes out of the housing 11, is disposed in the receiving space 213 and is exposed from the front window 212. Each of the connecting portions 22 has an extension segment 221 connected to the main body 21 and a fixing segment 222 extending from an end of the extension segment 221 opposite to the main body 21. In this embodiment, the connecting portions 22 extend from the surrounding wall 215 of the main body 21 in a manner of forming an inclusion angle therebetween and are asymmetrically arranged relative to the main body 21. The fixing segment 222 of each of the connecting portions 22 is formed with a mounting hole 223 for an external fixing member (not shown) to pass therethrough. The support of the vehicle may have two securing holes respectively registered with the mounting holes 223 of the connecting portions 22, such that corresponding ones of external fixing members pass through the mounting holes 223 of the connecting portions 22 and the securing holes of the support so as to secure the camera device to the support. In other words, the shape of mounting casing 2 and the configuration of the fixing segments 222 of the connecting portions 22 are able to conform to the configuration of the support, and arrangement of the camera device conforms with the arrangement of the support of the vehicle accordingly.

To be specific, the base member 3 is formed with at least one first fixing hole 31 and at least one second fixing hole 32. The housing 11 of the lens module 1 is formed with at least one first securing hole 115 registered with the at least one first fixing hole 31. The mounting casing 2 is formed with at least one second securing hole 23 registered with the at least one second fixing hole 32. The camera device further includes at least two fixing members 41, one of which passes through the at least one first fixing hole 31 and the at least one first securing hole 115 and the other one of which passes through the at least one second fixing hole 32 and the at least one second securing hole 23. In this embodiment, the respective number of the first fixing holes 31, the second fixing holes 32, the first securing hole 115 and the second securing holes 23 is two and the number of the fixing members 41 is four. By way of inclusion of the base member 3, separation of the housing 11 from the mounting casing 2 is avoided, and both the mounting casing 2 and the housing 11 are fixedly secured to the base member 3 with no relative movement therebetween. Hence, the housing 11 is positioned relative to the mounting casing 2. In this embodiment, the base member 3 includes a plate body 33. The plate body 33 abuts against the housing 11 of the lens module 1 and has an inwardly depressed notch 34 for the wire 13 of the lens module 1 to pass therethrough. More specifically, the plate body 33 of the base member 3 is formed with an inwardly depressed curved surface 331 that defines the inwardly depressed notch 34 so as to conform to a configuration of the wire 13 of the lens module 1. In other words, the inwardly depressed notch 34 corresponds in position to the rear through hole 112a of the housing 11 for the wire 13 to sequentially pass through the inwardly depressed notch 34 and the rear through hole 112a. The plate body 33 can be easily manufactured and mounted to the housing 22 and the mounting casing 2. For example, the base member 3 may be a curved plate or a flat plate.

Referring to FIGS. 11 to 14, a second embodiment of the camera device is illustrated. The camera device of this embodiment has a structure similar to that of the first embodiment. However, the connecting portions 22 separately extend from the surrounding wall 215 of the main body 21 and exhibit non-mirror symmetry relative to the main body 21.

Referring to FIGS. 15 to 18, a third embodiment of the camera device is illustrated. The camera device of this embodiment has a structure similar to that of the first embodiment. However, the main body 21 of the mounting casing 2 is partially hollowed out. The connecting portions 22 separately and oppositely extend from the surrounding wall 215 of the main body 21 and have different sizes. The extension segment 221 and one of the connecting portions 22 is formed with two of the mounting holes 223.

Referring to FIGS. 19 to 22, a fourth embodiment of the camera device is illustrated. The camera device of this embodiment has a structure similar to that of the first embodiment. However, the main body 21 of the mounting casing 2 is partially hollowed out. The connecting portions 22 separately and oppositely extend from the surrounding wall 215 of the main body 21 and exhibit mirror symmetry relative to the main body 21. The extension and fixing segments 221, 222 of each of the connecting portions 22 are transverse to each other, and the fixing segment 222 of each of the connecting portions 22 is formed with two of the mounting holes 223.

Referring to FIGS. 23 to 26, a fifth embodiment of the camera device is illustrated. The camera device of this embodiment has a structure similar to that of the first embodiment. However, the main body 21 of the mounting casing 2 is partially hollowed out. The connecting portions 22 separately and oppositely extend from the surrounding wall 215 of the main body 21 and have different shapes, and each of the connecting portions 22 is formed with the mounting hole 223.

Referring to FIGS. 27 to 30, a sixth embodiment of the camera device is illustrated. The camera device of this embodiment has a structure similar to that of the first embodiment. However, the connecting portions 22 oppositely extend from the surrounding wall 215 of the main body 21 and connect to each other so as to have a plate shape.

Referring to FIGS. 31 to 34, a seventh embodiment of the camera device is illustrated. The camera device of this embodiment has a structure similar to that of the first embodiment. However, the connecting portions 22 inclinedly extend from the surrounding wall 215 of the main body 21 relative to the front wall 211 of the main body 21 and exhibit mirror symmetry relative to the main body 21. Each of the connecting portions 22 has an elastic hook 224 for engaging the support. The base member 3 includes two positioning portions 35 curvedly extending from the plate body 33, each of which is formed with a corresponding one of the second fixing holes 32.

Referring to FIGS. 35 to 38, an eighth embodiment of the camera device is illustrated. The camera device of this embodiment has a structure similar to that of the seventh embodiment. However, each of the connecting portions 22 has a hook groove 225 for engaging hooks (not shown) formed in the support. The two positioning portions 35 curvedly extend from the plate body 33, each of which is formed with a corresponding one of the second fixing holes 32.

The aforementioned second to eighth embodiments likewise show that the design of the mounting casing 2 may be varied based on the configuration of the support.

To sum up, by virtue of the design of the mounting casing 2 and the base member 3, it is convenient to mount and securely position the lens module 1 in the mounting casing 2, and also to mount the mounting casing 2 of the camera device of the disclosure to the support. Furthermore, since a part of the wire 13 is disposed in the accommodating space 113 of the housing 11 together with the electric circuit board 14, and the retaining collar 131 of the wire 13 is fitted in the rear through hole 112a of the housing 11, the wire 13 and the electric circuit board 14 are confined relative to each other in the accommodating space 113 of the housing 11, and the electrical disconnection between the wire 13 and the electric circuit board 14 can be avoided.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A camera device, comprising:
    a lens module including a housing, a camera unit fixedly mounted in and partially exposed from said housing, and a wire electrically connected to said camera unit;
    a mounting casing including a main body having a front wall formed with a front window and a surrounding wall peripherally extending from said front wall and cooperating with said front wall to define a receiving space that is in spatial communication with said front window and has an opening opposite to said front wall, and two connecting portions extending from said surrounding wall and being opposite to said front wall, said housing being disposed in said receiving space to expose said camera unit from said front window; and
    a base member connected to said housing of said lens module and said mounting casing in proximity to said opening of said receiving space,
    wherein said lens module further includes
        an electric circuit board disposed in said housing and electrically connected to said camera unit, and
        an electric connector unit disposed in said housing and electrically interconnecting said electric circuit board and said wire such that said wire of said lens module is electrically connected to said camera unit through said electric circuit board and said electric connector unit; and
    wherein said electric connector unit includes a first electric connector that is disposed on said electric circuit board and a second electric connector that electrically interconnects said wire of said lens module and said first electric connector.

2. The camera device of claim 1, wherein said base member includes a plate body that abuts against said housing of said lens module and that has an inwardly depressed notch for said wire of said lens module to pass therethrough.

3. The camera device of claim 2, wherein said plate body of said base member is formed with an inwardly depressed curved surface that defines said inwardly depressed notch so as to conform to a configuration of said wire of said lens module.

4. The camera device of claim 1, wherein said base member is formed with at least one first fixing hole and at least one second fixing hole, said housing of said lens module being formed with at least one first securing hole registered with said at least one first fixing hole, said mounting casing being formed with at least one second securing hole registered with said at least one second fixing hole; and wherein said camera device further comprises at least two fixing members, one of which passes through said first fixing and securing holes and the other one of which passes through said second fixing and securing holes.

5. The camera device of claim 1, wherein said housing of said lens module includes a front housing part and a rear housing part engaged with each other to define an accommodating space for accommodating said camera unit, said electric circuit board and said electric connector unit, said front housing part being formed with a front through hole for exposing said camera unit, said rear housing part being formed with a rear through hole for said wire to pass therethrough.

6. The camera device of claim 5, wherein said wire of said lens module further includes a retaining collar fitted in said rear through hole of said housing of said lens module so as to confine said wire relative to said housing.

7. The camera device of claim 6, wherein said housing of said lens module further includes a sealing member interposed between said front housing part and said rear housing part.

8. The camera device of claim 5, wherein said housing further includes a protrusion projecting from said front housing part toward said accommodating space for abutment of said electric circuit board of said lens module thereagainst.

9. A camera device, comprising:
    a lens module including a housing, a camera unit fixedly mounted in and partially exposed from said housing, and a wire electrically connected to said camera unit;
    a mounting casing including a main body having a front wall formed with a front window and a surrounding wall peripherally extending from said front wall and cooperating with said front wall to define a receiving space that is in spatial communication with said front window and has an opening opposite to said front wall, and two connecting portions extending from said surrounding wall and being opposite to said front wall, said housing being disposed in said receiving space to expose said camera unit from said front window; and
    a base member connected to said housing of said lens module and said mounting casing in proximity to said opening of said receiving space;
    wherein said lens module further includes
        an electric circuit board disposed in said housing and electrically connected to said camera unit, and
        an electric connector unit disposed in said housing and electrically interconnecting said electric circuit board and said wire such that said wire of said lens module is electrically connected to said camera unit through said electric circuit board and said electric connector unit,
    wherein said housing of said lens module includes a front housing part and a rear housing part engaged with each other to define an accommodating space for accommodating said camera unit, said electric circuit board and said electric connector unit, said front housing part being formed with a front through hole for exposing said camera unit, said rear housing part being formed with a rear through hole for said wire to pass therethrough; and
    wherein said wire of said lens module further includes a retaining collar fitted in said rear through hole of said housing of said lens module so as to confine said wire relative to said housing.

10. The camera device of claim 9, wherein said housing of said lens module further includes a sealing member interposed between said front housing part and said rear housing part.

11. A camera device, comprising:
    a lens module including a housing, a camera unit fixedly mounted in and partially exposed from said housing, and a wire electrically connected to said camera unit;

a mounting casing including a main body having a front wall formed with a front window and a surrounding wall peripherally extending from said front wall and cooperating with said front wall to define a receiving space that is in spatial communication with said front window and has an opening opposite to said front wall, and two connecting portions extending from said surrounding wall and being opposite to said front wall, said housing being disposed in said receiving space to expose said camera unit from said front window; and a base member connected to said housing of said lens module and said mounting casing in proximity to said opening of said receiving space, wherein said base member is formed with at least one first fixing hole and at least one second fixing hole, said housing of said lens module being formed with at least one first securing hole registered with said at least one first fixing hole, said mounting casing being formed with at least one second securing hole registered with said at least one second fixing hole; and wherein said camera device further comprises at least two fixing members, one of which passes through said first fixing and securing holes and the other one of which passes through said second fixing and securing holes.

* * * * *